(12) United States Patent
Ahn

(10) Patent No.: US 7,348,198 B2
(45) Date of Patent: Mar. 25, 2008

(54) LIQUID CRYSTAL DISPLAY DEVICE AND FABRICATING METHOD THEREOF

(75) Inventor: Byung Chul Ahn, Anyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 119 days.

(21) Appl. No.: 11/292,060

(22) Filed: Dec. 2, 2005

(65) Prior Publication Data

US 2006/0121634 A1   Jun. 8, 2006

(30) Foreign Application Priority Data

Dec. 4, 2004   (KR) .................. 10-2004-0101551

(51) Int. Cl.
*H01L 21/00* (2006.01)
(52) U.S. Cl. .................. 438/30; 438/70; 438/551; 257/E21.183; 257/E21.258; 257/E21.351
(58) Field of Classification Search .......... 438/30, 438/43, 70, 149, 161, 513, 551, 733, 734, 438/680
See application file for complete search history.

(56) References Cited

U.S. PATENT DOCUMENTS 6,211,553 B1 * 4/2001 Sung .................. 257/347
6,319,760 B1   11/2001 Lee et al.
6,323,528 B1 * 11/2001 Yamazaki et al. .......... 257/411
6,822,261 B2 * 11/2004 Yamazaki et al. ........... 257/59
6,862,051 B2 * 3/2005 Ahn et al. .................. 349/44
7,019,797 B2 * 3/2006 Choi et al. .................. 349/43
7,133,104 B2 * 11/2006 Kim et al. .................. 349/147

FOREIGN PATENT DOCUMENTS

CN   1550857   12/1994

* cited by examiner

*Primary Examiner*—David Nhu
(74) *Attorney, Agent, or Firm*—McKenna Long & Aldridge LLP

(57) ABSTRACT

A liquid crystal display device and a fabricating method thereof for simplifying a process and improving an aperture ratio are disclosed, including forming a first mask pattern group including a gate line, a gate electrode and a common line; forming a second mask pattern group including a semiconductor pattern and a source/drain pattern having a data line, a source electrode and a drain electrode overlapped thereon on the gate insulating film using a second mask; and forming a third mask pattern group including and a pixel electrode making an interface with the protective film in the pixel hole to be connected to the drain electrode, thereby forming a horizontal electric field with the common electrode, using a third mask.

22 Claims, 40 Drawing Sheets

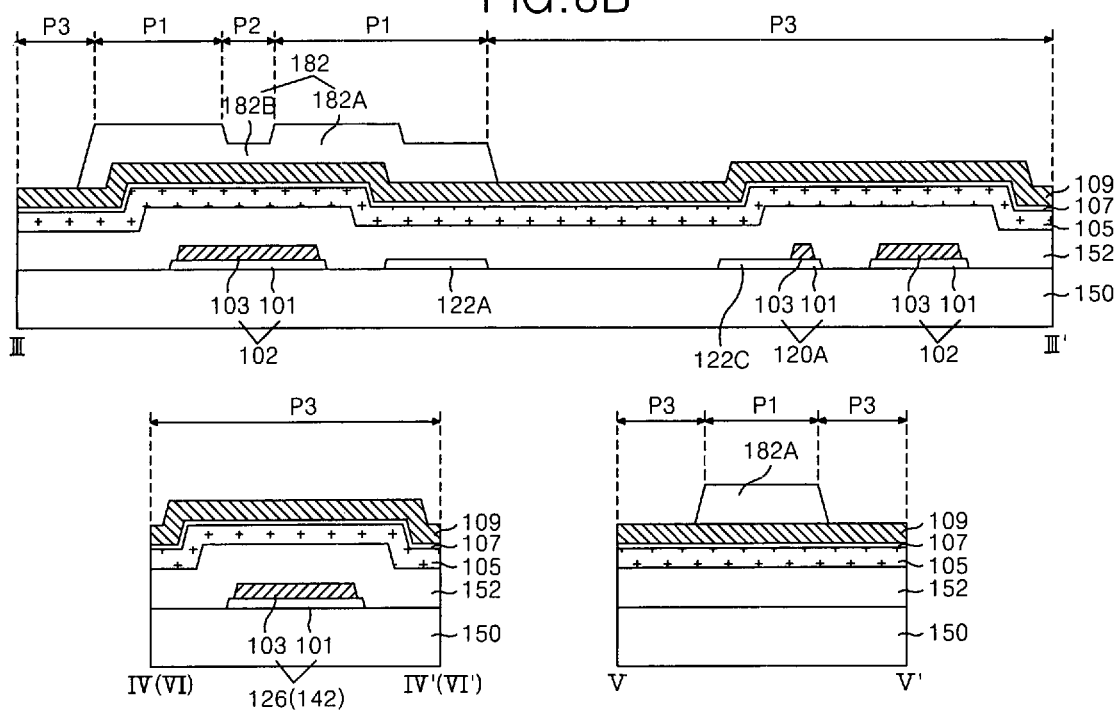

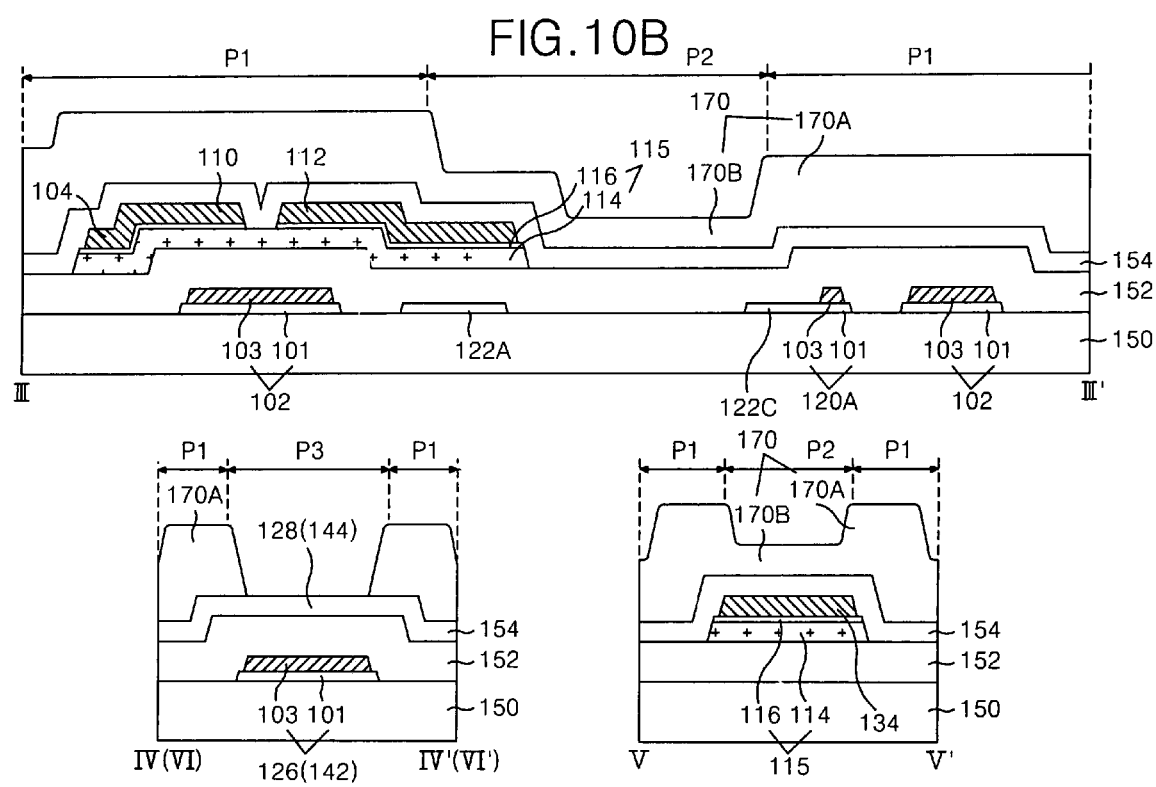

LIQUID CRYSTAL DISPLAY DEVICE AND FABRICATING METHOD THEREOF

This application claims the benefit of Korean Patent Application No. P2004-101551 filed in Korea on Dec. 4, 2004, which is hereby incorporated by reference for all purposes as if fully set forth herein.

BACKGROUND OF THE INVENTION

1. Field of the Invention

This invention relates to a liquid crystal display device using a horizontal electric field, and more particularly to the thin film transistor substrate of horizontal electric field applying type and a fabricating method thereof that are adaptive for simplifying a process.

2. Description of the Related Art

Generally, a liquid crystal display (LCD) controls light transmittance of a liquid crystal having a dielectric anisotropy using an electric field to thereby display a picture. To this end, the LCD includes a liquid crystal display panel for displaying a picture by a liquid crystal cell matrix, and a driving circuit for driving the liquid crystal display panel.

Referring to FIG. 1, a related art liquid crystal display panel is comprised of a color filter substrate 10 and the thin film transistor substrate 20 that are joined to each other with a liquid crystal 24 therebetween.

The color filter substrate 10 includes a black matrix 4, a color filter 6 and a common electrode 8 that are sequentially provided on an upper glass substrate 2. The black matrix 4 is provided in a matrix type on the upper glass substrate 2. The black matrix 4 divides an area of the upper glass substrate 2 into a plurality of cell areas to be provided with the color filter 6, and prevents a light interference between adjacent cells and an external light reflection. The color filter 6 is provided at the cell area divided by the black matrix 4 in such a manner to be divided into red(R), green(G) and blue(B) ones, thereby transmitting red, green and blue lights. The common electrode 8 is formed of a transparent conductive layer entirely coated onto the color filter 6, and supplies a common voltage Vcom that serves as a reference voltage upon driving of the liquid crystal 24. Further, an over-coated layer (not illustrated) for smoothing the color filter 6 may be provided between the color filter 6 and the common electrode 8.

The thin film transistor substrate 20 includes a thin film transistor 18 and a pixel electrode 22 provided for each cell area defined by a crossing of a gate line 14 and a data line 16 at a lower glass substrate 12. The thin film transistor 18 applies a data signal from the data line 16 to the pixel electrode 22 in response to a gate signal from the gate line 14. The pixel electrode 22 formed of a transparent conductive layer supplies a data signal from the thin film transistor 18 to drive the liquid crystal 24.

The liquid crystal 24 having a dielectric anisotropy is rotated in accordance with an electric field formed by a data signal from a pixel electrode 22 and a common voltage Vcom from the common electrode 8 to control light transmittance, thereby implementing a gray scale level.

Further, the liquid crystal display panel includes a spacer (not illustrated) for constantly maintaining a cell gap between the color filter substrate 10 and the thin film transistor substrate 20.

In such a liquid crystal display panel, the color filter substrate 10 and the thin film transistor substrate 20 are formed by a plurality of mask processes. Herein, one mask process includes a lot of processes such as thin film deposition (coating), cleaning, photolithography, etching, photoresist stripping and inspection processes, etc.

Particularly, since the thin film transistor substrate includes the semiconductor process and requires the plurality of mask processes, it has a complicated fabricating process to act as a major factor in the manufacturing cost rise of the liquid crystal display panel. Therefore, the thin film transistor substrate has been developed toward a reduction in the number of mask process.

Meanwhile, the liquid crystal displays are classified into a vertical electric field applying type and a horizontal electric field applying type depending upon with a direction of the electric field driving the liquid crystal.

The liquid crystal display of vertical electric field applying type drives a liquid crystal in a twisted nematic (TN) mode with a vertical electric field formed between a pixel electrode and a common electrode arranged in opposition to each other on the upper and lower substrate. The liquid crystal display of vertical electric field applying type has an advantage of a large aperture ratio while having a drawback of a narrow viewing angle about 90°.

The liquid crystal display of horizontal electric field applying type drives a liquid crystal in an in plane switching (IPS) mode with a horizontal electric field between the pixel electrode and the common electrode arranged in parallel to each other on the lower substrate. The liquid crystal display of horizontal electric field applying type has an advantage of a wide viewing angle about 160°.

The thin film transistor substrate in the liquid crystal display of horizontal electric field applying type also requires a plurality of mask process to have a drawback of a complicated fabricating process. Therefore, in order to reduce the manufacturing cost, it is necessary to reduce the number of mask processes.

Furthermore, the thin film transistor substrate in the liquid crystal display device of horizontal electric field applying type includes a common electrode and a pixel electrode taking a finger image at each pixel area so as to form a horizontal electric field. Herein, since the common electrode is generally formed from a gate metal, that is, an opaque metal along with the gate line, there is raised a problem in that an aperture ratio is reduced.

SUMMARY OF THE INVENTION

Accordingly, it is an advantage of the present invention to provide a liquid crystal display device of horizontal electric field applying type and a fabricating method thereof that are adaptive for simplifying a process.

Another advantage of the present invention is to provide a liquid crystal display device of horizontal electric field applying type and a fabricating method thereof that are adaptive for improving an aperture ratio.

In order to achieve these and other advantages of the invention, the liquid crystal display device according to one aspect of the present invention comprises a gate line on a substrate in a double conductive layer structure having a first transparent conductive layer and a second opaque conductive layer; a data line crossing the gate line with a gate insulating film to define a pixel area; a thin film transistor including a gate electrode connected to the gate line, a source electrode connected to the data line, a drain electrode connected to the source electrode and a semiconductor pattern for defining a channel between the source electrode and the drain electrode; a common line on the substrate in the double conductive layer structure in parallel to the gate line; a common electrode provided by an extension of a first conductive layer of the common line in the pixel area; a protective film on the thin film transistor and the data line; and a pixel electrode in a pixel hole passing through the protective film in such a manner to make an interface with the protective film and connected to the drain electrode, the pixel electrode being formed a horizontal electric field with the common electrode.

A method of fabricating a liquid crystal display device according to another aspect of the present invention comprises forming a first mask pattern group including a gate line, a gate electrode and a common line having a double-layer structure of a first transparent conductive layer and a second opaque conductive layer, and a common electrode having a single-layer structure of a first conductive layer of the common line on a substrate using a first mask; forming a gate insulating film on the first mask pattern group; forming a second mask pattern group including a semiconductor pattern and a source/drain pattern having a data line, a source electrode and a drain electrode overlapped thereon on the gate insulating film using a second mask; forming a protective film on the second mask pattern group; and forming a pixel hole passing through the protective film, and forming a third mask pattern group including and a pixel electrode making an interface with the protective film in the pixel hole to be connected to the drain electrode, thereby forming a horizontal electric field with the common electrode, using a third mask.

BRIEF DESCRIPTION OF THE DRAWINGS

These and other objects of the invention will be apparent from the following detailed description of the embodiments of the present invention with reference to the accompanying drawings.

In the drawings:

FIG. 8A to FIG. 8E are sectional views for specifically explaining the second mask process;

FIG. 10A to FIG. 10F are sectional views for specifically explaining the third mask process;

DETAILED DESCRIPTION OF THE PREFERRED EMBODIMENT

Hereinafter, the preferred embodiments of the present invention will be described in detail with reference to FIG. 2 to FIG. 17E.

Figure 1:
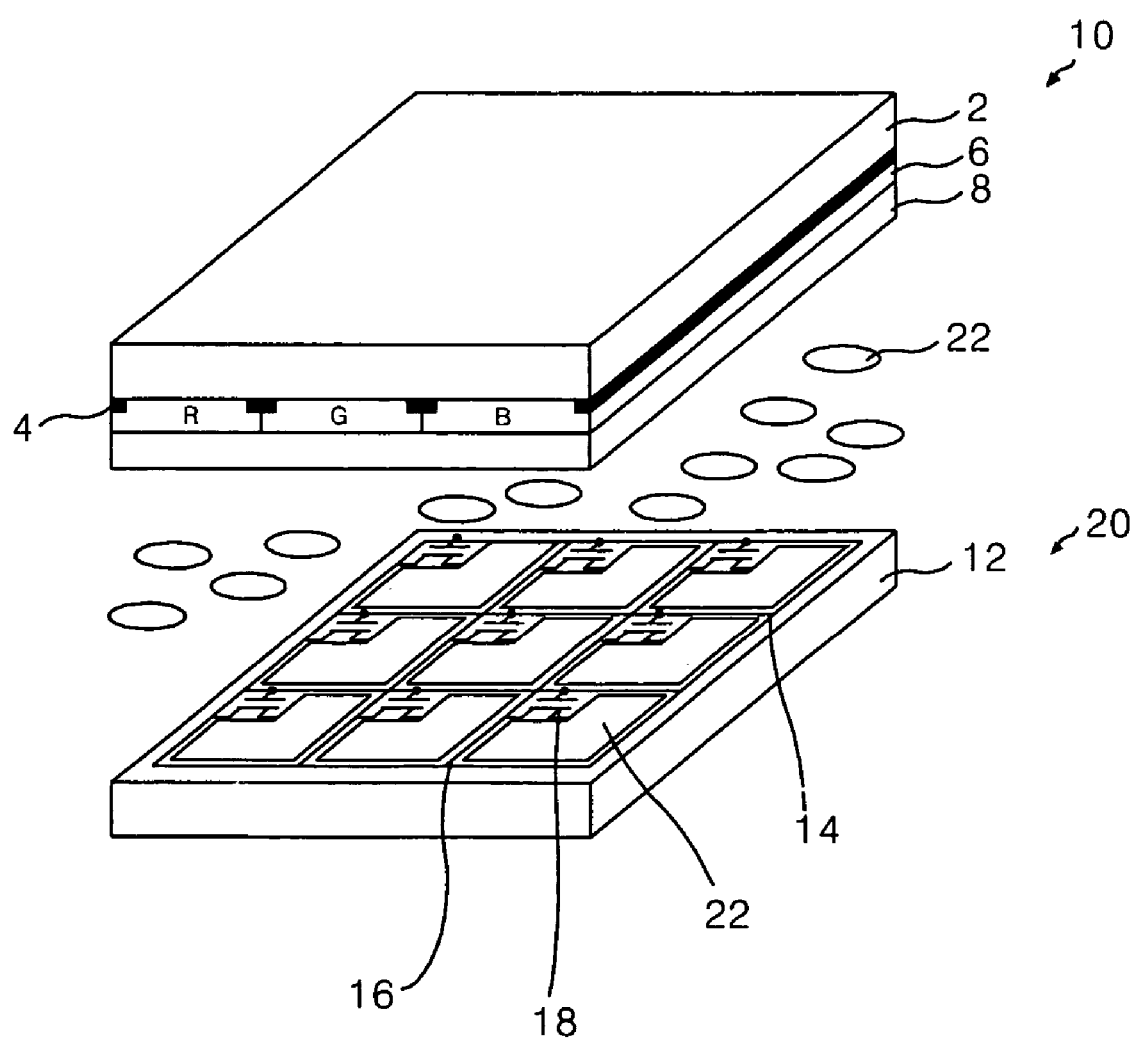
FIG. 1 is a schematic perspective view illustrating a structure of a related art liquid crystal display panel.
Figure 2:
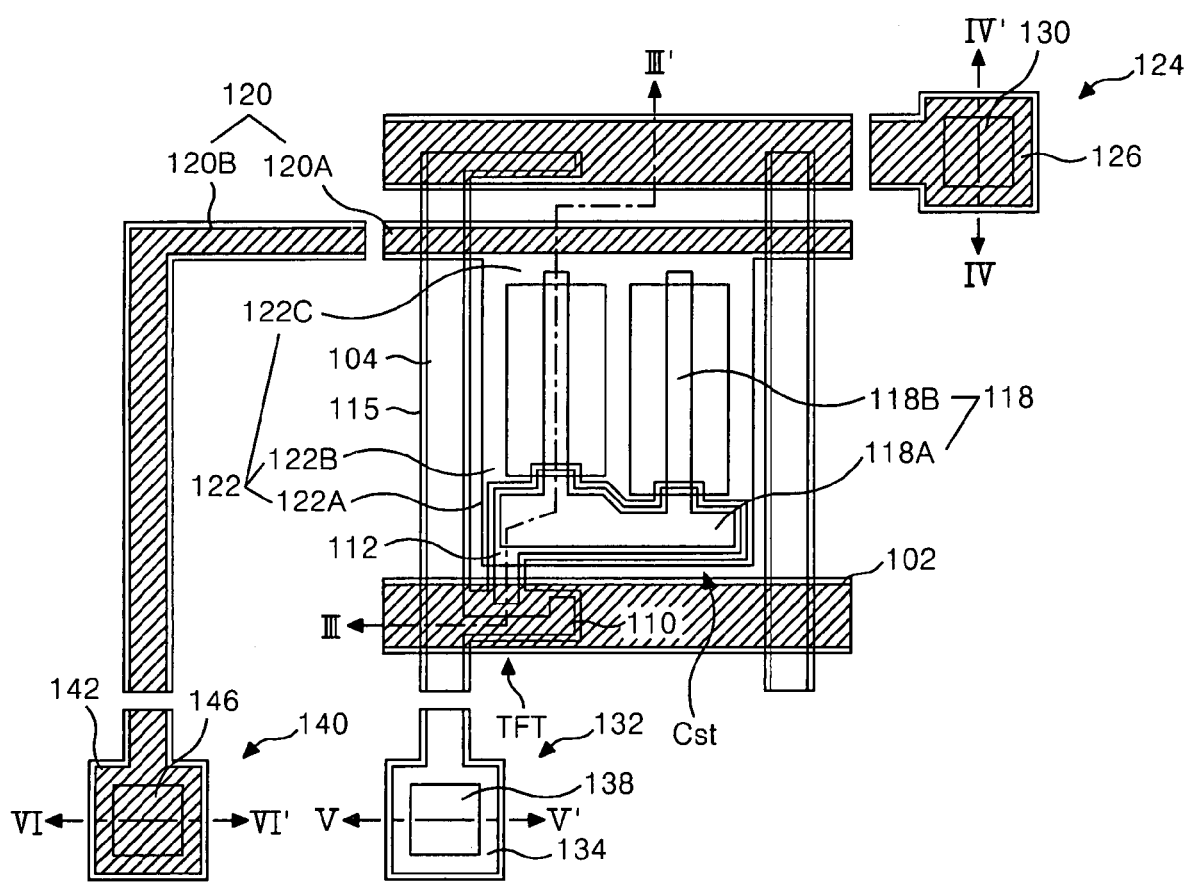
FIG. 2 is a plan view illustrating a portion of a thin film transistor substrate of horizontal electric field according to a first embodiment of the present invention.
Figure 3:
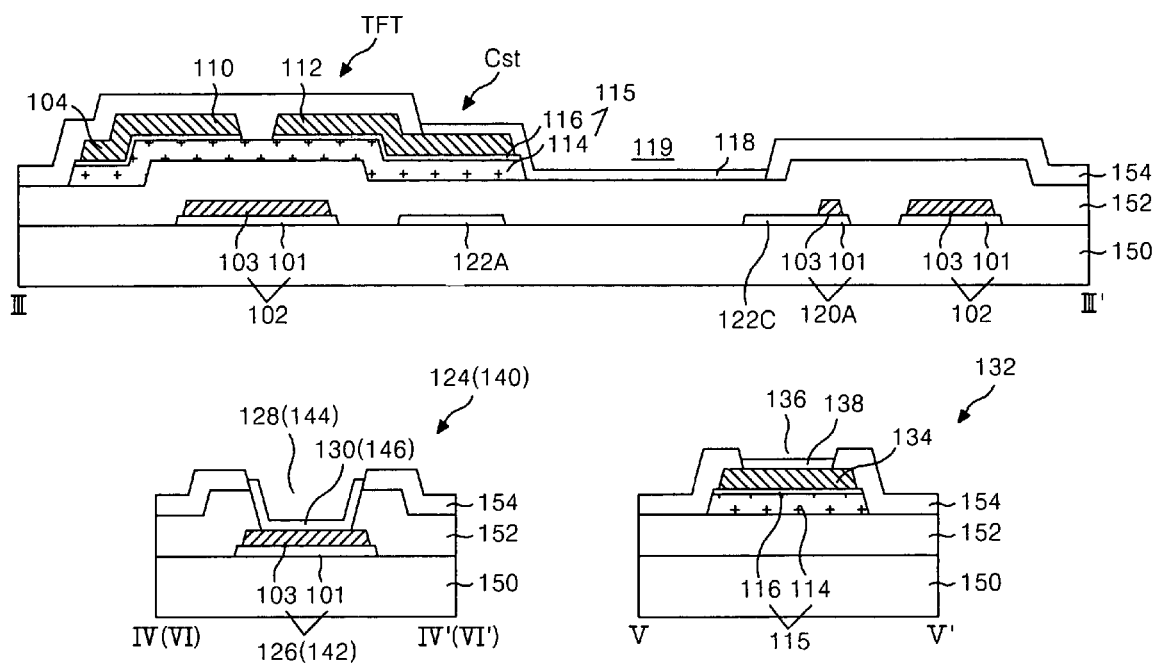
FIG. 3 is a sectional view of the thin film transistor substrate of horizontal electric field taken along the III-III', IV-IV', V-V', VI-VI' lines in FIG. 2.

FIG. 2 is a plan view illustrating a structure of a thin film transistor substrate of horizontal electric field applying type according to a first embodiment of the present invention, and FIG. 3 is a sectional views of the thin film transistor substrate taken along the III-III', IV-IV', V-V', and VI-VI'lines in FIG. 2.

Referring to FIG. 2 and FIG. 3, the thin film transistor substrate of horizontal electric field applying type includes a gate line 102 and a data line 104 provided on a lower substrate 150 in such a manner to intersect each other with having a gate insulating film 152 therebetween and define a pixel area, a thin film transistor TFT connected to the gate line 102, the data line 104, a pixel electrode 118, a pixel electrode 118 and a common electrode 122 provided to form a horizontal electric field at said pixel area, and a common line 120 connected to the common electrode 122. Further, the thin film transistor substrate includes a storage capacitor Cst provided at an overlapping portion between the common electrode 122 and the drain electrode 112, a gate pad 124 connected to the gate line 102, a data pad 132 connected to the data line 104, and a common pad 140 connected to the common line 120.

The gate line 102 supplies a scanning signal from a gate driver (not illustrated) while the data line 104 supplies a video signal from a data driver (not illustrated). The gate line 102 and the data line 104 cross each other with having a gate insulating film 152 therebetween to define each pixel area. Herein, the gate line 102 has a double-layer structure in which a first conductive layer 101 formed of a transparent conductive layer and a second conductive layer 103 formed of an opaque metal are built.

The thin film transistor allows a video signal applied to the data line 104 to be charged into a pixel electrode 118 and be kept in response to a scanning signal applied to the gate line 102. To this end, the thin film transistor TFT includes a gate electrode included in the gate line 102, a source electrode 110 connected to the data line 104, a drain electrode 112 positioned in opposition to the source electrode 110 to be connected to a pixel electrode 118, an active layer 114 overlapping with the gate line 102 with the gate insulating film 152 therebetween to define a channel between the source electrode 110 and the drain electrode 112, and an ohmic contact layer 116 formed on the active layer 114 other than the channel portion to form an ohmic contact with the source electrode 110 and the drain electrode 112.

Further, a semiconductor layer 115 including the active layer 114 and the ohmic contact layer 116 is overlapped along the data line 104 and the lower data pad electrode 134.

The common line 120 and the common electrode 122 supply a reference voltage for driving the liquid crystal, that is, a common voltage to each pixel.

The common line 120 includes an internal common line 120A provided in parallel to the gate line 102 at a display area, and an external common line 120B commonly connected to the internal common line 120A at an non-display area. Such a common line 120 is formed in a double-layer structure of the first and second conductive layers 101 and 103 like the gate line 102.

The common electrode 122 is provided in the pixel area to be connected to the internal common line 120A. More specifically, the common electrode 122 includes a first horizontal part 122A adjacent to the gate line 102, and a finger part 122B extended from the first horizontal part 122A toward the pixel area. Further, the common electrode 122 may include a second horizontal part 122C commonly connected to a finger part 122B and connected to the internal common line 120A. The common electrode 122 is formed from a transparent conductive layer like the first conductive layer 101 of the common line 120.

The storage capacitor Cst is provided such that the first horizontal part 122A of the common electrode 122 overlaps with the drain electrode 112 with the gate insulating film 152 and the semiconductor pattern 115 therebetween. Herein, the drain electrode 112 is provided in such a manner to be extended from an overlapping part between it and the thin film transistor TFT, that is, the gate line 102 and be overlapped with the first horizontal part 122A of the common electrode 122 as widely as possible. Thus, a capacitance value of the storage capacitor Cst is increased by the wide overlapping area between the common electrode 122 and the drain electrode 112, so that the storage capacitor Cst allows a video signal charged in a pixel electrode 118 to be stably maintained until the next signal is charged.

The pixel electrode 118 is provided in such a manner to make an interface with the protective film 154 within a pixel hole 119 passing through the protective film 154, and is connected to the drain electrode 112.

Specifically, a pixel hole 119 includes a non-overlapping portion at which it does not overlaps with the common electrode 122, and an overlapping portion at which it overlaps with the common electrode 122. The non-overlapping portion of the pixel hole 119 passes through the protective film 154 in parallel to the finger part 122B of the common electrode 122 to expose the gate insulating film 152. The overlapping portion of the pixel hole 119 passes through the protective film 154 to expose the drain electrode 112 overlapped with the first finger part 122A and the lower portion of the finger part 122B of the common electrode 122.

Since the pixel electrode 118 is provided in such a manner to make an interface with the protective film 154 within the pixel hole 119, it includes a horizontal part 118A entirely connected to the drain electrode 112, and a finger part 118B extended from the horizontal part 118A in parallel to the finger part 122B of the common electrode 122. In this case, the drain electrode 112 and the semiconductor pattern 115 exist in the overlapping portion between the pixel electrode 118 and the common electrode 122 to prevent an etching of the gate insulating film 152 under them, thereby preventing a short badness between the pixel electrode 118 and the common electrode 122.

If a video signal is applied, via the thin film transistor, to a pixel electrode 118, then a horizontal electric field is formed between the finger part 118B of a pixel electrode 118 and the finger part 122B of the common electrode 122 supplied with the common voltage. Liquid crystal molecules arranged in the horizontal direction between the thin film transistor array substrate and the color filter array substrate by such a horizontal electric field is rotated due to a dielectric anisotropy. Transmittance of a light transmitting the pixel area is differentiated depending upon a rotation extent of the liquid crystal molecules, thereby implementing a gray level scale.

The gate line 102 connected to the gate driver (not illustrated) via the gate pad 124. The gate pad 124 includes a lower gate pad electrode 126 extended from the gate line 102, and an upper gate pad electrode 130 provided in a first contact hole 128 passing through the gate insulating film 152 and the protective film 154 to be connected to the lower gate pad electrode 126. Herein, the lower gate pad electrode 126 has a double-layer structure in which the first and second conductive layers 101 and 103 are built like the gate line 102.

The data line 104 connected, via the data pad 132, to a data driver (not illustrated). The data pad 132 includes a lower data pad electrode 134 extended from the data line 104 along with the semiconductor pattern 115 under it, an upper data pad electrode 138 connected to the lower data pad electrode 134 exposed by way of a second contact hole 136 passing through the protective film 154.

The common line 120 receives a reference voltage from a common voltage source (not illustrated) via the common pad 140. The common pad 140 includes a lower common pad electrode 142 extended from the external common line 120B, and an upper common pad electrode 146 connected to the lower common pad electrode 142 exposed by way of a third contact hole 144 passing through the gate insulating film 152 and the protective film 154. Herein, the lower common pad electrode 142 has a double-layer structure in which the first and second conductive layers 101 and 103 are built like the common line 120.

As described above, in the thin film transistor substrate of horizontal electric field applying type according to the present invention, the common electrode 122 is formed of a transparent conductive layer in similarity to the pixel electrode 118 to thereby improve an aperture ratio. This is caused by a fact that, if a horizontal electric field is formed between the finger part 122B of the common electrode 122 and the finger part 118B of the pixel electrode 118, then each side (an area positioned inwardly about 1 μm from the edge) of each finger part 122B and 118B formed of a transparent conductive layer can contribute to an aperture ratio. Also, the common line 120 has a double-layer structure in which the first and second conductive layers 101 and 103 are built, thereby reducing a line resistance.

Figure 4:
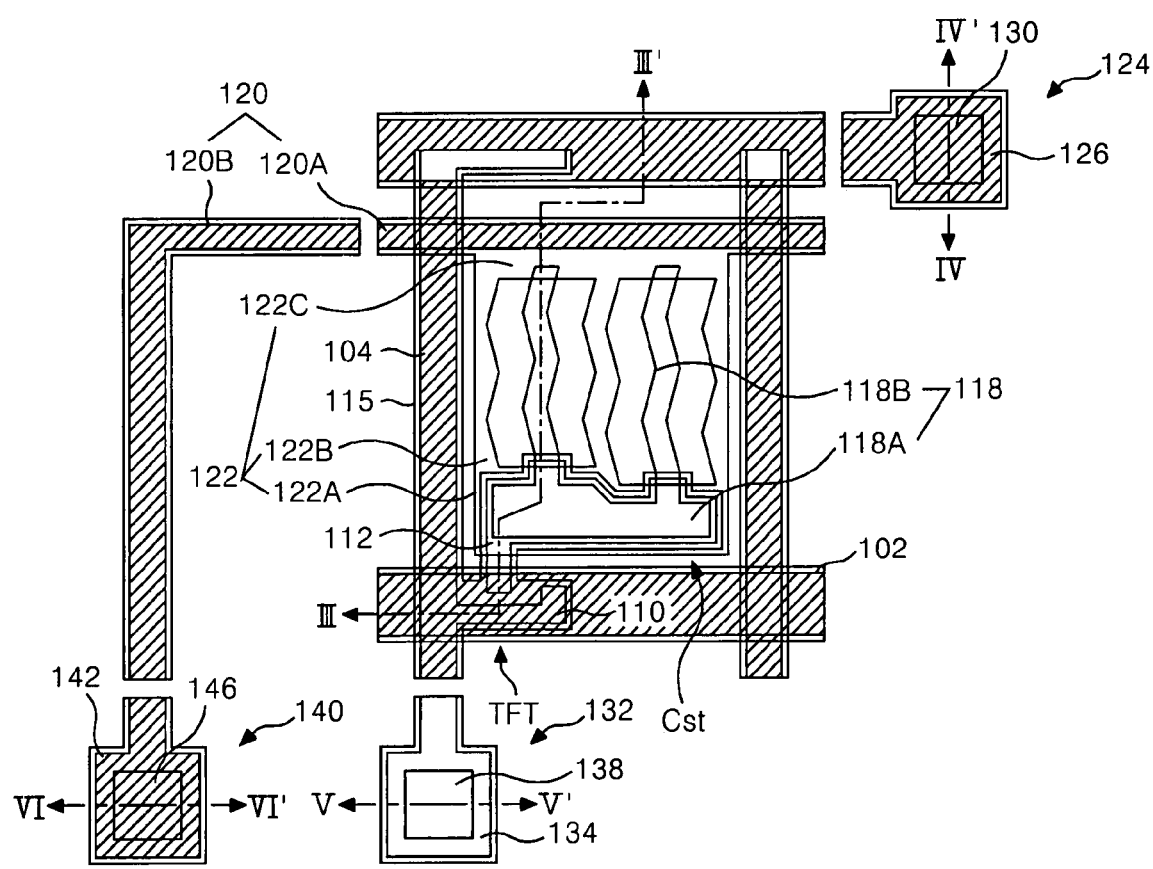
FIG. 4 is a plan view illustrating a structure of the common electrode and the pixel electrode in the thin film transistor substrate of horizontal electric field applying type illustrated in FIG. 2.

Further, as illustrated in FIG. 4, the finger part 122B of the common electrode 122 and the finger part 118B of the pixel electrode 118 may be formed in a zigzag manner. In this case, the edge adjacent to the data line 104 in the finger part 122B of the common electrode 122 may be formed in parallel to the data line 104, or in a zigzag manner. Alternatively, the data line 104 may be formed in a zigzag manner along the finger part 122B of the adjacent common electrode 122.

The thin film transistor substrate according to the present invention having the above-mentioned structure and advantages is formed by the following three-round mask process.

Figure 5A:
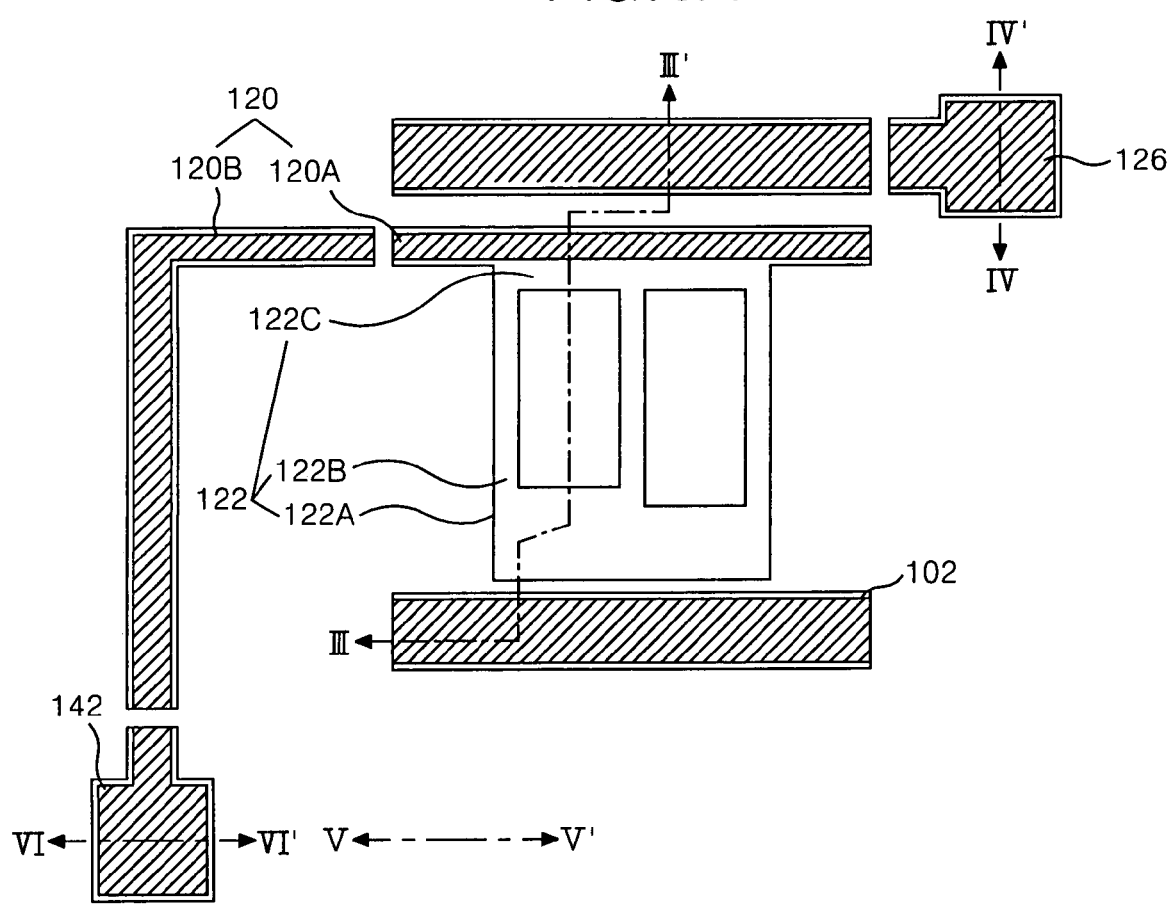
FIG. 5A and FIG. 5B are a plan view and a sectional view for explaining a first mask process in a method of fabricating the thin film transistor substrate of horizontal electric field applying type according to a first embodiment of the present invention.
Figure 5B:
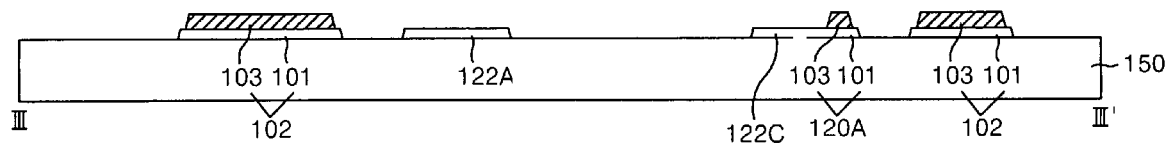
Figure 5B:
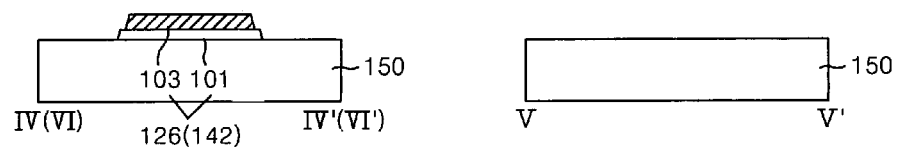
Figure 6A:
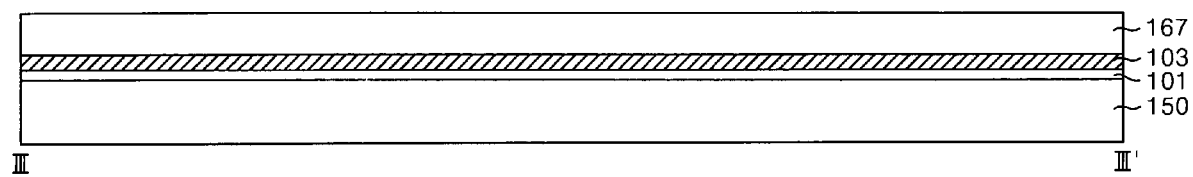
FIG. 6A to FIG. 6E are section views illustrating the first mask process of the present invention.
Figure 6A:
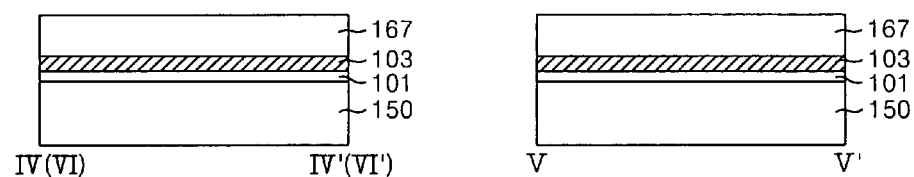
Figure 6B:
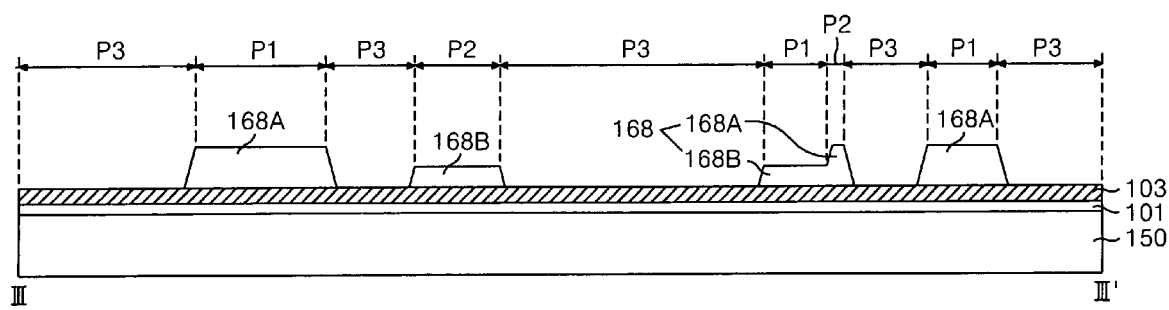
Figure 6B:
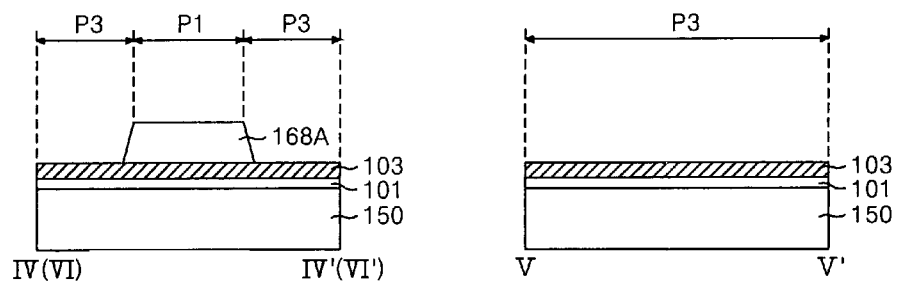
Figure 6C:
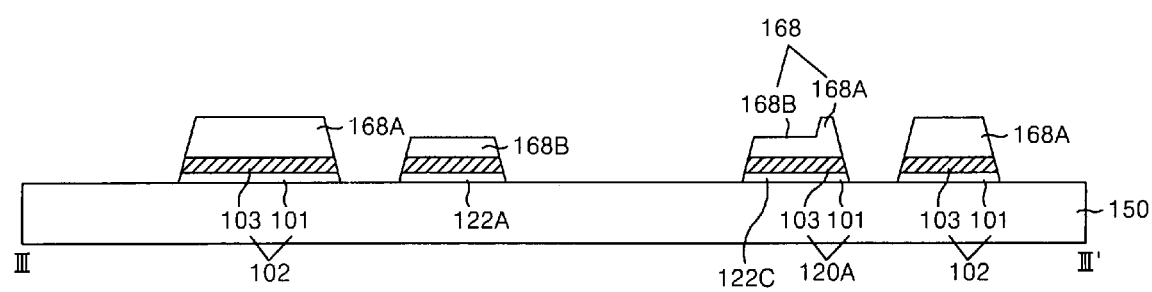
Figure 6C:
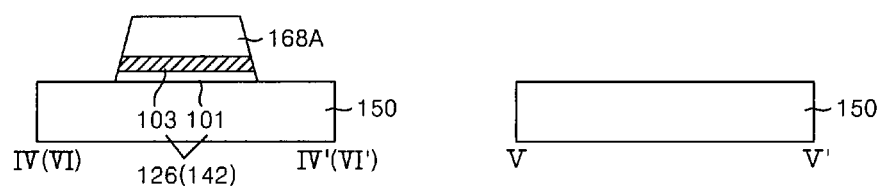

FIG. 5A and FIG. 5B are a plan view and a sectional view for explaining a first mask process, respectively, in a method of fabricating the thin film transistor substrate of horizontal electric field applying type according to the embodiment of the present invention, and FIG. 6A to FIG. 6C are section views for specifically explaining the first mask process.

A first mask pattern group including the gate line 102, the lower gate pad electrode 126, the common line 120, the common electrode 122 and the lower common pad electrode 142 is formed on the lower substrate 142 by the first mask process. Herein, the first mask pattern group other than the common electrode 122 has a double-layer structure in which the first and second conductive layers 101 and 103 are built, whereas the common electrode 122 has a single-layer structure formed only of the first conductive layer 101. The first mask pattern group having such double-layer and single-layer structure is formed by a single of mask process employing a half tone mask or a diffractive exposure mask. Hereinafter, a case where the half tone mask is used for the first mask will be described for an example.

Referring to FIG. 6A, the first and second conductive layers 101 and 103 are deposited onto the lower substrate 142 by a deposition method such as the sputtering, etc, and a first photo-resist 167 is formed thereon. The first conductive layer 101 is formed of a transparent conductive material such as ITO, TO, IZO or ITZO, etc. On the other hand, the second conductive layer 103 is formed of a metal material such as Mo, Ti, Cu, AlNd, Al, Cr, a Mo alloy such as MoW, or a Cu alloy, etc.

Next, the first photo-resist 167 is exposed to the light and developed by the photolithography using the half tone mask to thereby provide a first photo-resist pattern 168 having step coverage as illustrated in FIG. 6B. The half tone mask is divided into a shielding part for shielding an ultraviolet ray UV, a partial transmitting part for partially transmitting the ultraviolet ray, and a full transmitting part for fully transmitting the ultraviolet ray. Accordingly, the first photo-resist pattern 168A is left at the shielding area P1 overlapping with the shielding part of the half tone mask while the first photo-resist pattern 168B thinner than the first photo-resist pattern 168A is left at a partial exposure area P2 overlapping with the partial transmitting part. On the other hand, the photo-resist at a full exposure area P3 overlapping with the full transmitting part is removed.

Then, the first and second conductive layers 101 and 103 are patterned by an etching process using the first photo-resist pattern 168, thereby providing the first mask pattern group including a double-layer structure of the gate line 102, the lower gate pad electrode 126, the common line 120, the common electrode 122 and the lower common pad electrode 142 as illustrated in FIG. 6C.

Figure 6D:
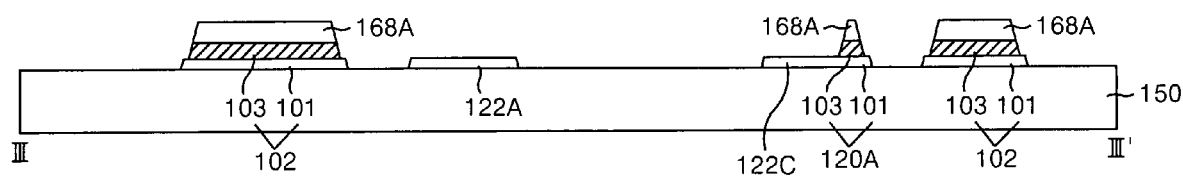
Figure 6D:
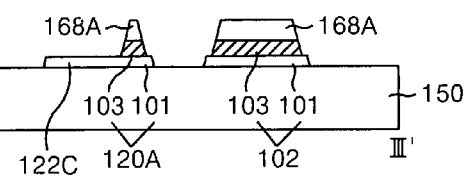
Figure 6D:
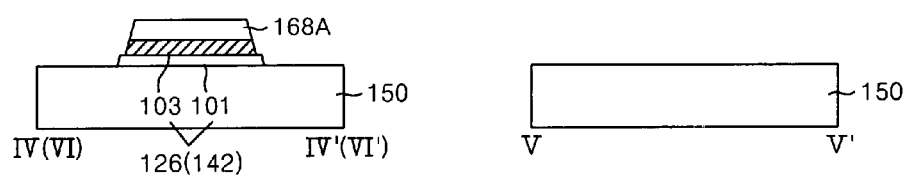
Figure 6D:
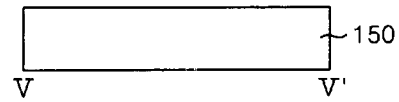

Referring to FIG. 6D, a thickness of the first photo-resist pattern 168A is thinned while the first photo-resist pattern 168B is removed by the ashing process using an oxygen ($O_2$) plasma. Further, the second conductive layer 103 on the common electrode 122 is removed by the etching process using the ashed first photo-resist pattern 168A. In this case, each side of the patterned second conductive layer 103 is again etched along the ashed first photo-resist pattern 168A, thereby allowing the first and second conductive layers 101 and 103 of the first mask pattern group to have a constant step coverage taking a stepwise shape. Accordingly, when the side surfaces of the first and second conductive layers 101 and 103 have a high steep inclination, it becomes possible to prevent a step coverage badness of the gate insulating film 152 that may be generated thereon.

Figure 6E:
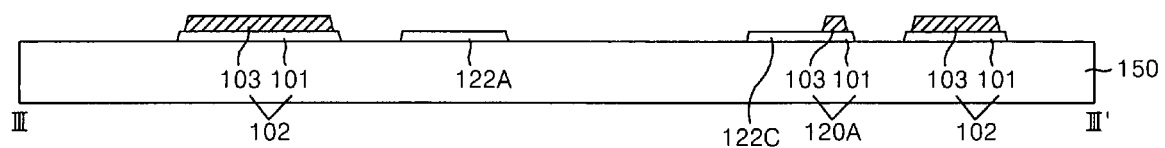
Figure 6E:
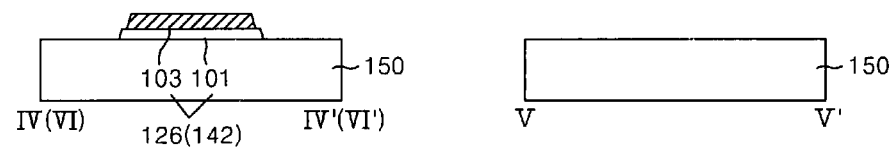

The first photo-resist pattern 168A left on the first mask pattern group is removed as illustrated in FIG. 6E.

Figure 7A:
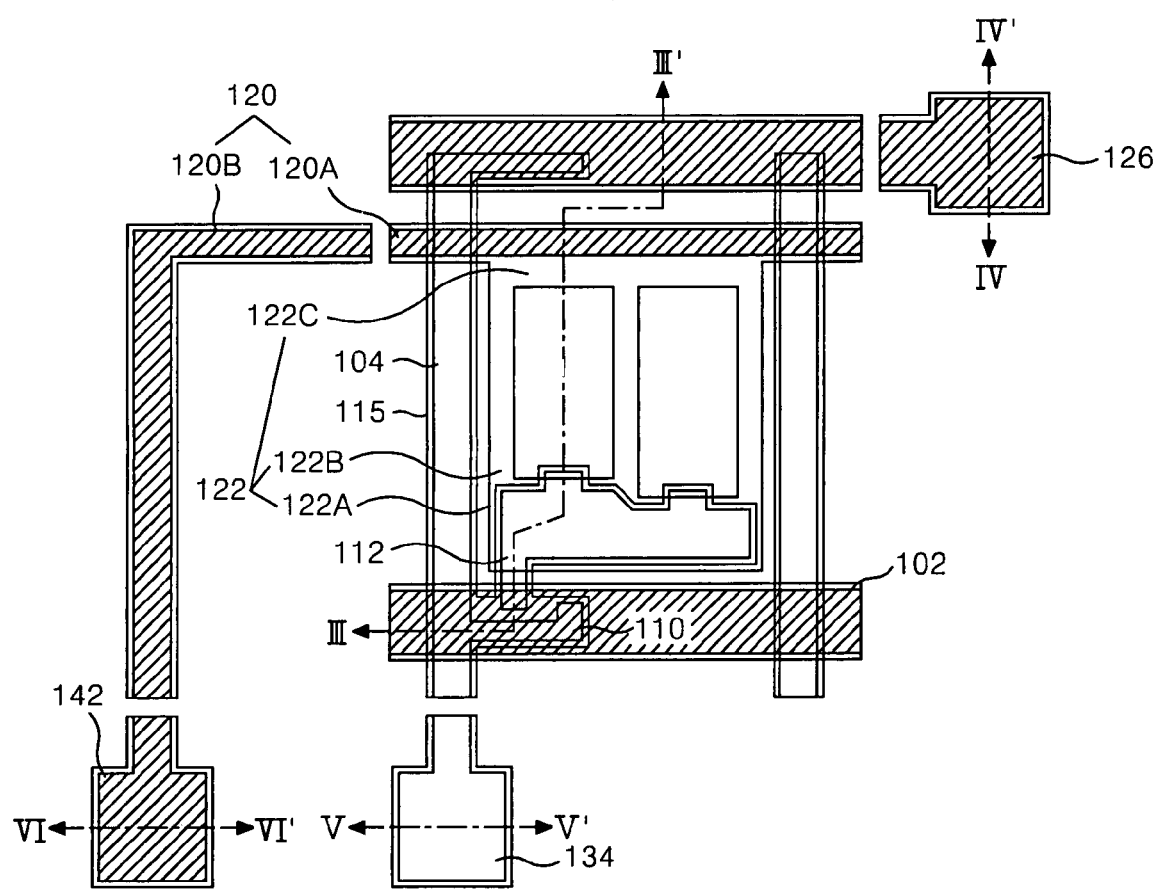
FIG. 7A and FIG. 7B are a plan view and a sectional view for explaining a second mask process in a method of fabricating the thin film transistor substrate of horizontal electric field applying type according to a first embodiment of the present invention.
Figure 7B:
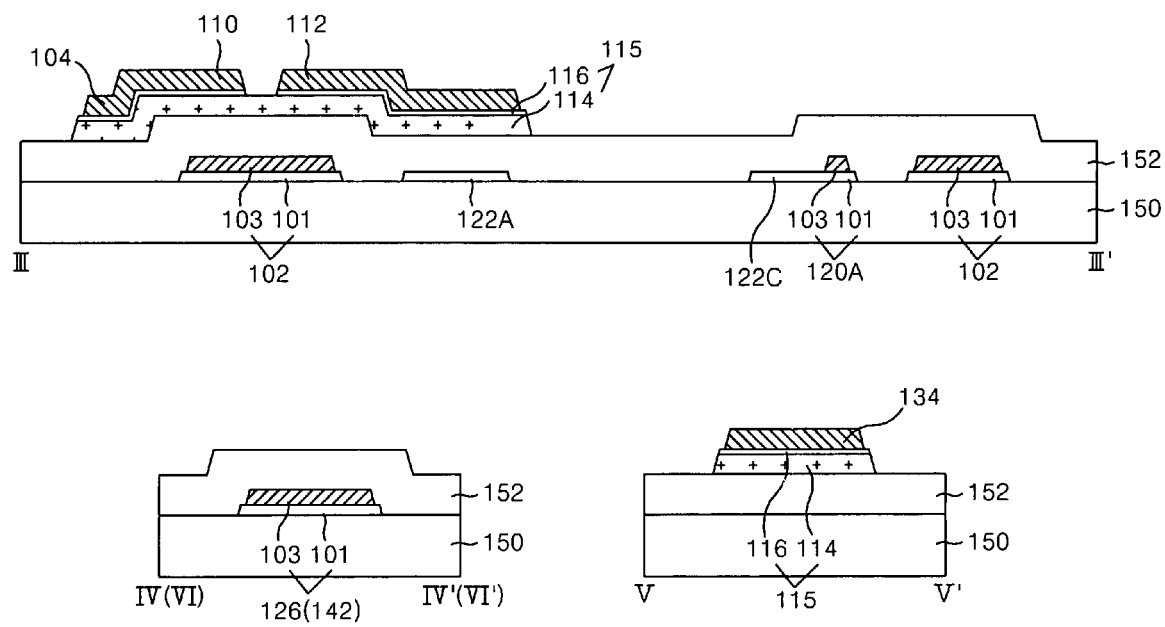

FIG. 7A and FIG. 7B are a plan view and a section view for explaining a second mask process in a method of fabricating the thin film transistor substrate according to the embodiment of the present invention, respectively, and FIG. 8A to FIG. 8E are sectional views for specifically explaining the second mask process.

The gate insulating film 152 is formed on the lower substrate 150 provided with the first mask pattern group, and a second mask pattern group having a source/drain pattern including the data line 104, the source electrode 110, the drain electrode 112 and the lower data pad electrode 134; and a semiconductor pattern 115 including the active layer 114 and the ohmic contact layer 116 overlapped along the rear side of the source/drain pattern are formed by the second mask process thereon. Such a second mask pattern group is formed by a single of mask process employing a diffractive exposure mask or a half tone mask. Hereinafter, a case where the diffractive exposure mask is used for the second mask will be described.

Figure 8A:
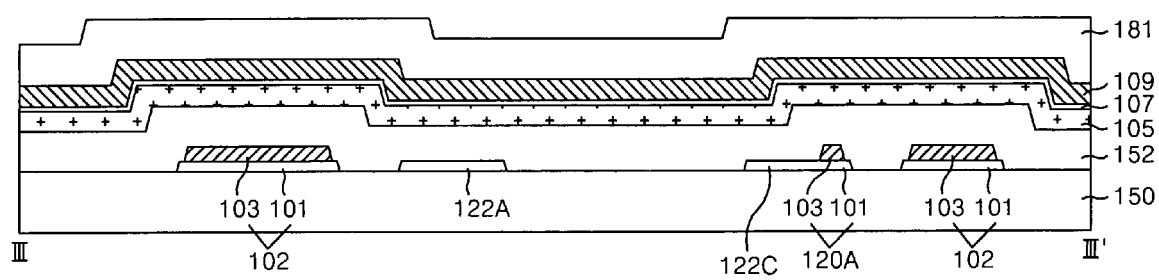
Figure 8A:
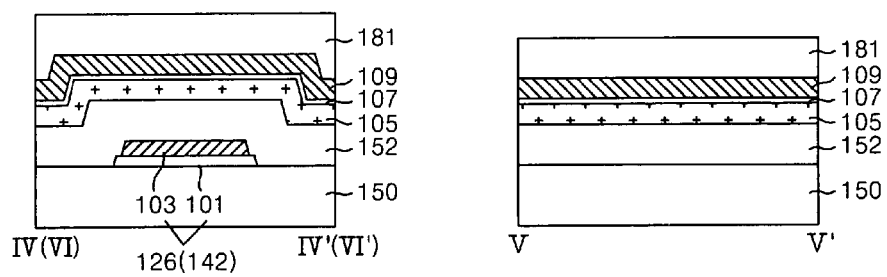

As illustrated in FIG. 8A, the gate insulating film 152, an amorphous silicon layer 105, an amorphous silicon layer 107 doped with an $n^+$ or $p^+$ impurity, and the source/drain metal layer 109 are sequentially formed on the lower substrate 150 provided with the first mask pattern group. For example, the gate insulating film 152, an amorphous silicon 105, an amorphous silicon layer 107 doped with an $n^+$ or $p^+$ impurity are formed by the PECVD, whereas the source/drain metal layer 109 is formed by the sputtering. The gate insulating film 152 is formed of an inorganic insulating material such as silicon nitride ($SiN_x$) or silicon oxide ($SiO_x$), whereas the source/drain metal layer 109 is formed of a metal material such as Cr, Mo, MoW, Al/Cr, Cu, Al(Nd), Al/Mo, Al(Nd)/Al, Al(Nd)/Cr, Mo/Al(Nd)/Mo, Cu/Mo, Ti/Al(Nd)/Ti, Mo/Al, Mo/Ti/Al(Cu), Cu-alloy/Mo, Cu-alloy/Al, Cu-alloy/Mo-alloy, Cu-alloy/Al-alloy, Al/Mo alloy, Mo-alloy/Al, Al-alloy/Mo-alloy, Mo-alloy/Al-alloy, etc. Further, a second photo-resist 181 is coated onto the source/drain metal layer 109.

Subsequently, the second photo-resist 181 is exposed and developed by the photolithography employing a diffractive exposure mask to thereby provide a second photo-resist pattern 182 having step coverage as illustrated in FIG. 8B. The diffractive exposure mask is divided into a shielding part for shielding an ultraviolet ray, a partial transmitting part for diffracting the ultraviolet ray, and a full transmitting part for fully transmitting the ultraviolet ray. Accordingly, a second photo-resist pattern 182A is left at a shielding area P1 overlapping with the shielding part of the diffractive exposure mask while a second photo-resist pattern 182B thinner than the second photo-resist pattern 182A is left at a diffractive exposure area P2 overlapping with the partial transmitting part. On the other hand, the second photo-resist at a full exposure area P3 overlapping with the full transmitting part is removed.

Figure 8C:
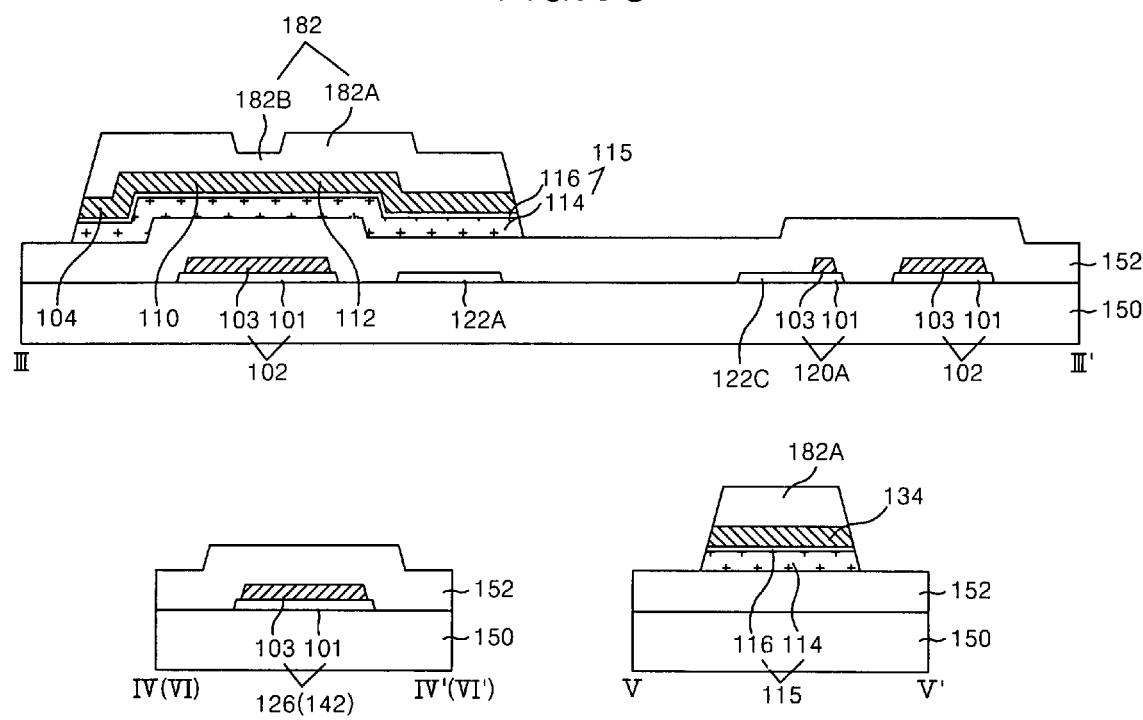

Then, the source/drain metal layer 109, an amorphous silicon layer 107 doped with an n+ or p+ impurity and an amorphous silicon layer 105 are patterned by an etching process using the second photo-resist pattern 182, thereby providing a source/drain pattern including the data line 104, the source electrode 110, the drain electrode 112 and the lower data pad electrode 134; and a semiconductor pattern 115 under it as illustrated in FIG. 8C. Particularly, the drain electrode 112 is integral to the source electrode 110 and is overlapped with the first horizontal part 122A of the common electrode 122; and is protruded in such a manner to capture the edge of the first horizontal part 122A to be overlapped with the pixel electrode in the succeeding process.

Figure 8D:
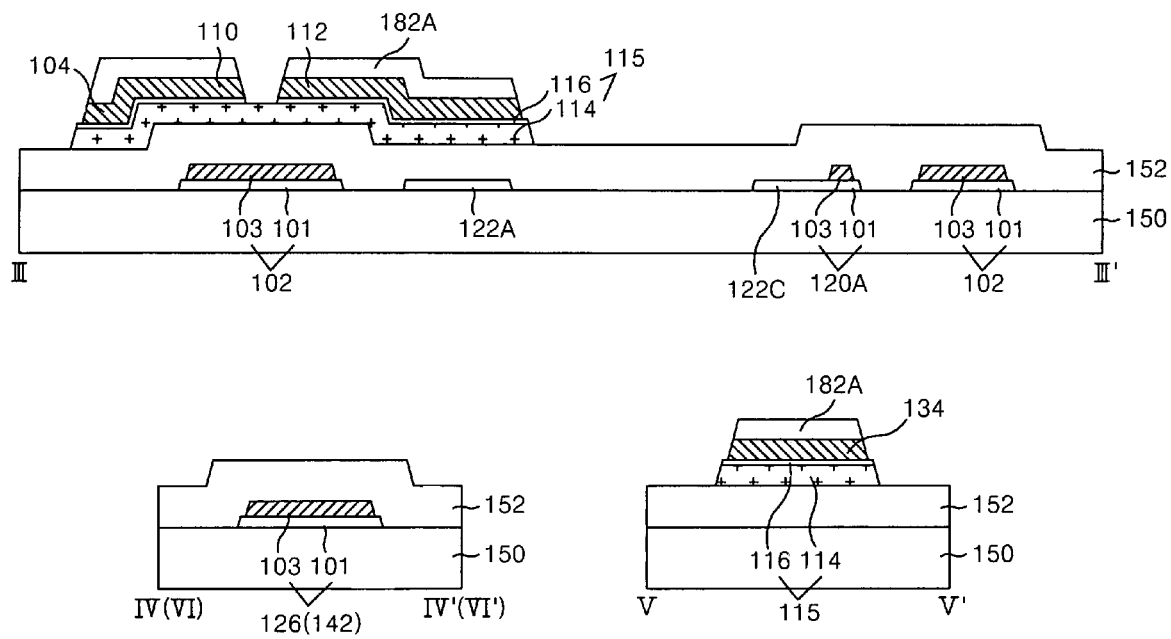

Next, as illustrated in FIG. 8D, a thickness of the second photo-resist pattern 182A is thinned while the second photo-resist pattern 182B is removed by the ashing process using an oxygen ($O_2$) plasma. Further, the exposed source/drain metal pattern and the ohmic contact layer 116 under it are removed by the etching process using the ashed second photo-resist pattern 182A. Thus, the source electrode 110 and the drain electrode 112 are disconnected from each other, and the active layer 114 is exposed. In this case, each side of the source/drain pattern is again etched along the ashed second photo-resist pattern 182A, thereby allowing the source/drain pattern and the semiconductor pattern 115 to have a constant step coverage taking a stepwise shape.

Figure 8E:
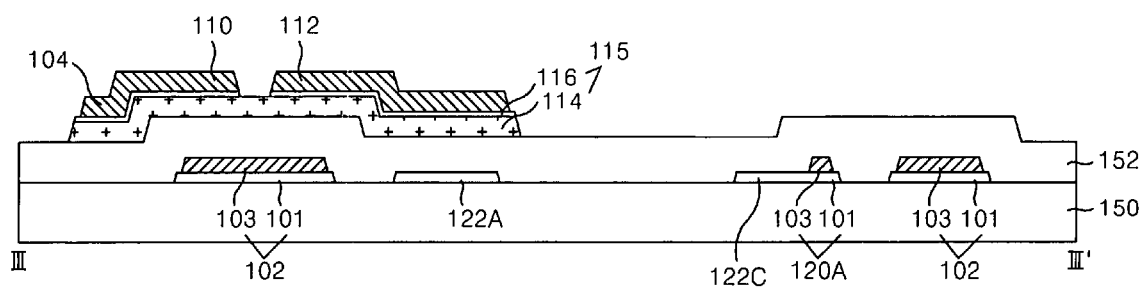
Figure 8E:
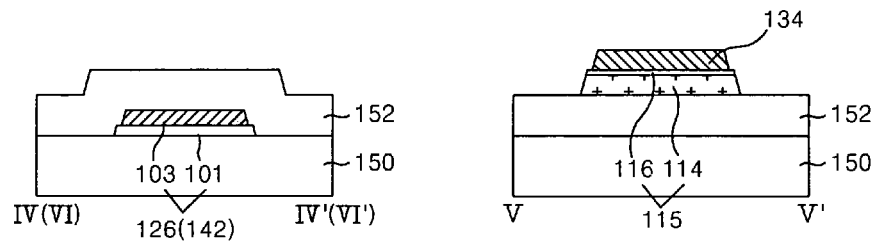

The second photo-resist pattern 182A left on the source/drain pattern is removed as illustrated in FIG. 8E by the stripping process.

Figure 9A:
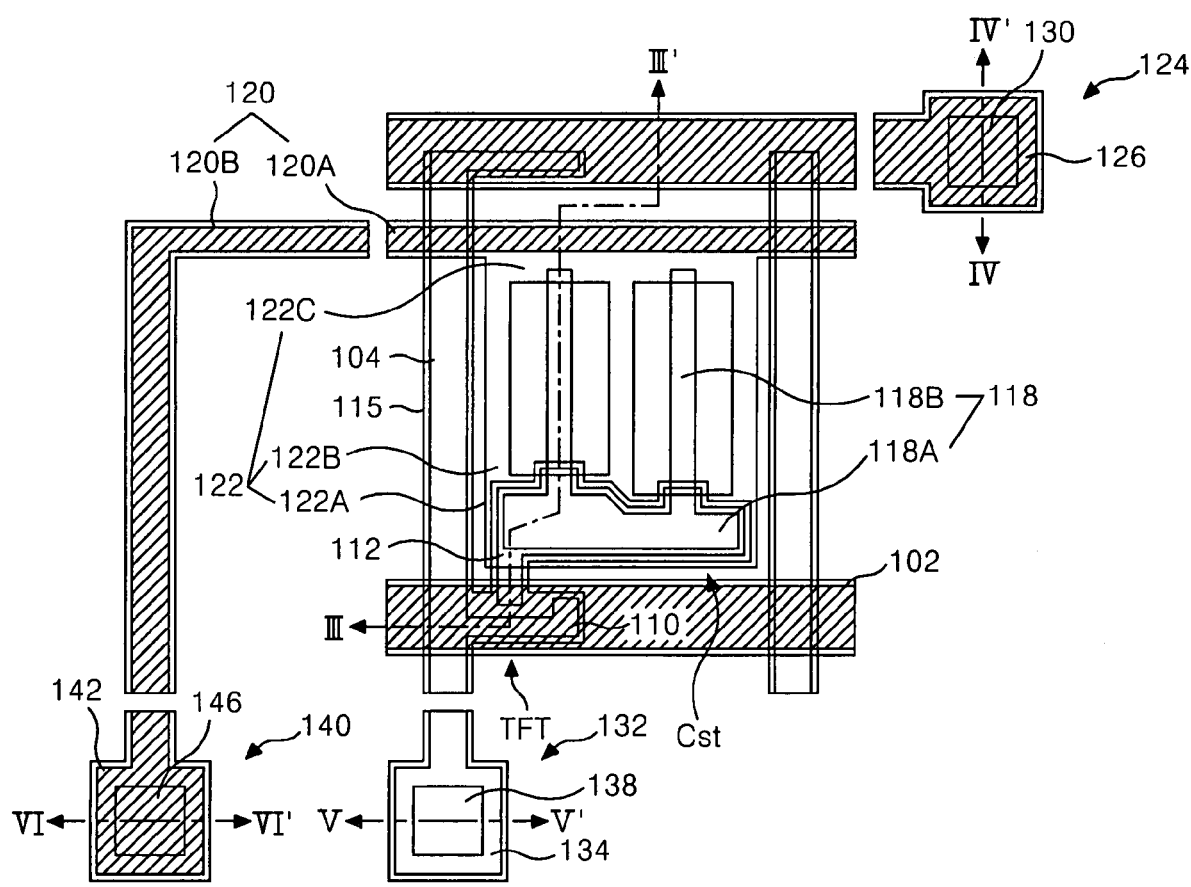
FIG. 9A and FIG. 9B are a plan view and a sectional view for explaining a third mask process in a method of fabricating the thin film transistor substrate of horizontal electric field applying type according to a first embodiment of the present invention.
Figure 9B:
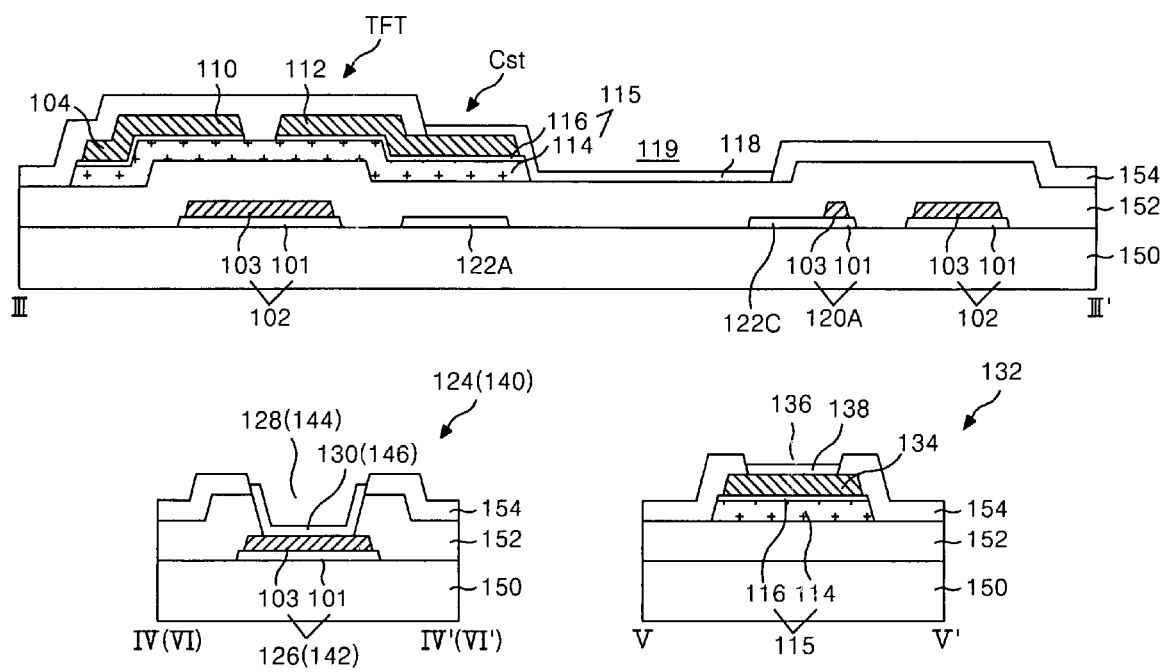

FIG. 9A and FIG. 9B are a plan view and a sectional view for explaining a third mask process in a method of fabricating the thin film transistor substrate according to the embodiment of the present invention, respectively, and FIG. 10A to FIG. 10F are sectional views for specifically explaining the third mask process.

By the third mask process, the protective film 154 including the pixel hole 119 and the first to third contact holes 128, 136 and 144 is formed; and a third mask pattern group including the pixel electrode 118, an upper gate pad electrode 130, an upper data pad electrode 138 and an upper common pad electrode 146 are formed. Herein, the third mask pattern group is formed by providing a transparent conductive layer on the photo-resist pattern used upon defining the pixel hole 119 and the first to third contact holes 128, 136 and 144 and then lifting off the photo-resist pattern.

Figure 10A:
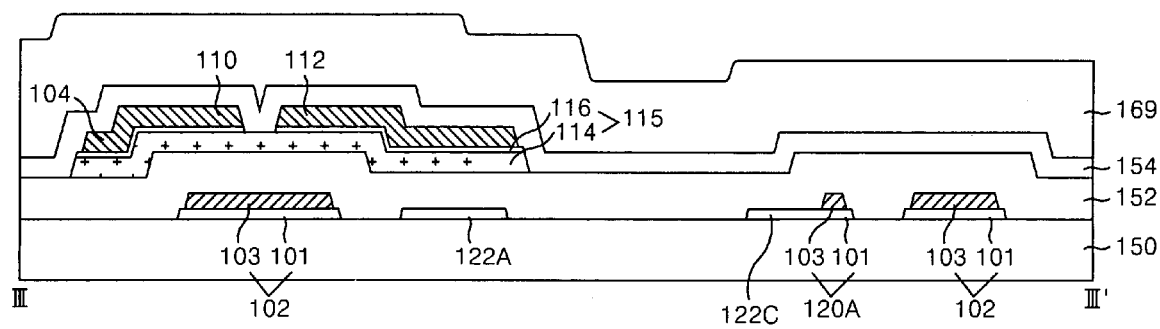
Figure 10A:
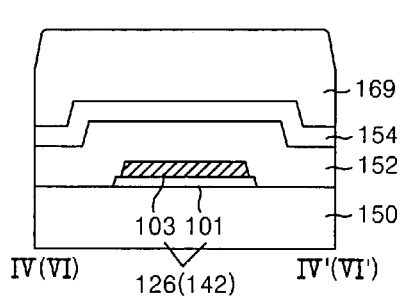
Figure 10A:
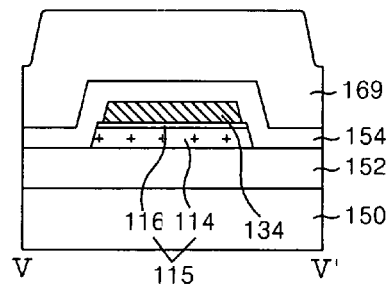

More specifically, as illustrated in FIG. 10A, the protective film 154 is formed on the gate insulating film 152 provided with the second mask pattern group by a technique such as the PECVD, the spin coating and the spinless coating etc.; and the third photo-resist 169 is formed thereon. The protective film 154 is formed of an inorganic insulating material identical to the gate insulating film 144, or an organic insulating material such as an acrylic organic compound having a small dielectric constant, BCB (benzocyclobutene) or PFCB (perfluorocyclobutane), etc.

Subsequently, the third photo-resist 169 is exposed and developed by the photolithography using a half tone mask or a diffractive exposure mask, thereby providing a third photo-resist pattern 170 having step coverage as illustrated in FIG. 10B. For example, when the half tone mask is used, a third photo-resist pattern 170A is left at a shielding area P1 overlapping with the shielding part of the half tone mask; a third photo-resist pattern 170B thinner than the third photo-resist pattern 170A is left at a partial exposure area P2 overlapping with the partial transmitting part; and the third photo-resist at a full exposure area P3 overlapping with the full transmitting part is removed.

Figure 10C:
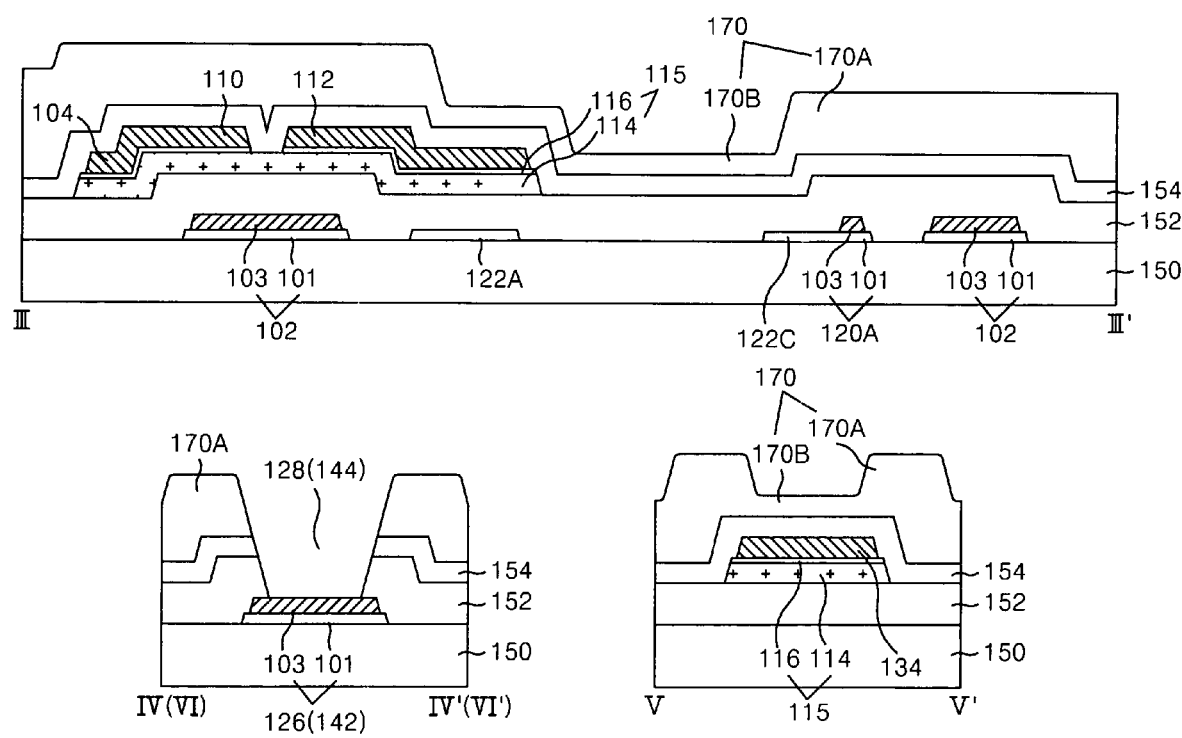

The protective film 154 exposed through the third photo-resist pattern 170 and the gate insulating film 152 under it are dry etched to thereby define the first and third contact holes 128 and 144 for exposing the lower gate pad electrode 126 and the lower common pad electrode 142, respectively as illustrated in FIG. 10C. A height of the third photo-resist pattern 170 is entirely lowered by such a dry etching process.

Figure 10D:
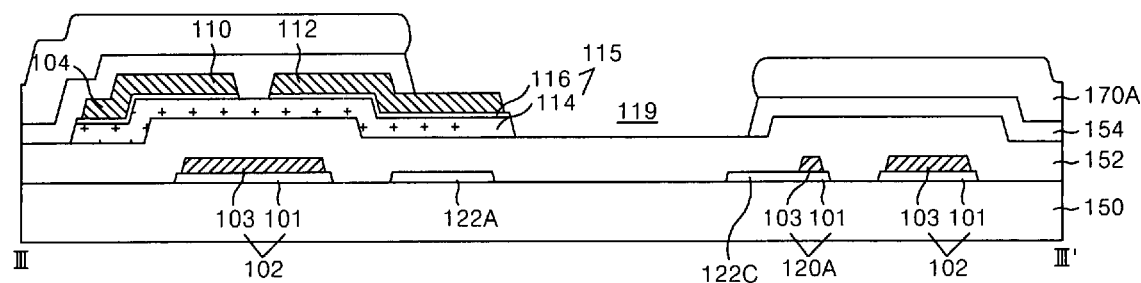
Figure 10D:
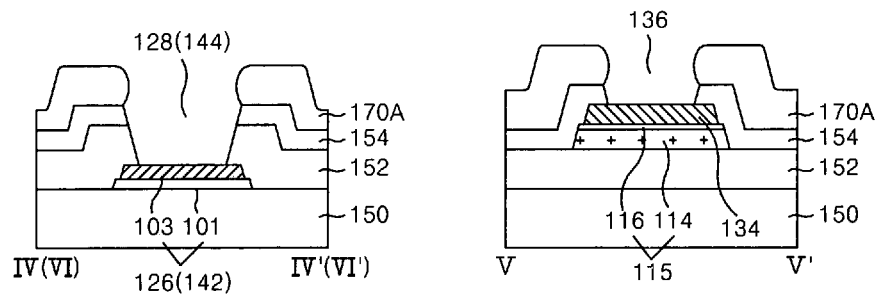

Then, as illustrated in FIG. 10D, a thickness of the third photo-resist pattern 170A is more reduced while the third photo-resist pattern 170B is removed by the ashing process. Further, the protective film 154 exposed through the ashed third photo-resist pattern 170A is dry-etched to thereby provide a pixel hole 119 for exposing the drain electrode 112 and a second contact hole 136 for exposing the lower data pad electrode 134. In this case, the edge of the ashed third photo-resist pattern 170A has more protruded shape than that of the protective film 154 by an over-etching of the protective film 154.

The dry etching process for etching the protective film 154 and the gate insulating film 152 and the ashing process of the third photo-resist pattern 170 are continuously performed within the same chamber.

Figure 10E:
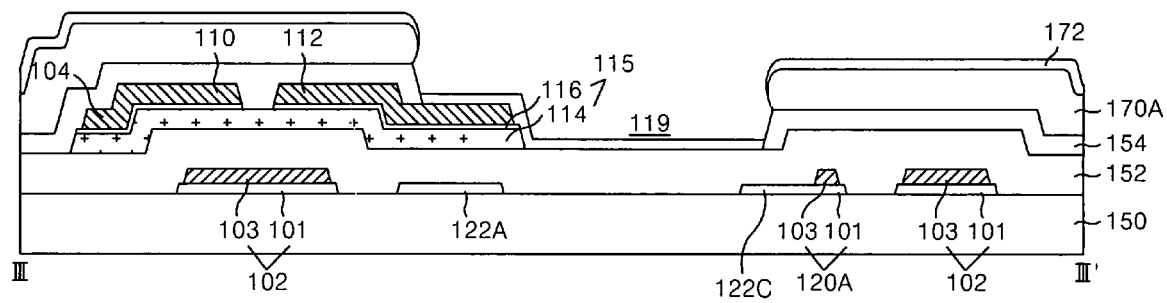
Figure 10E:
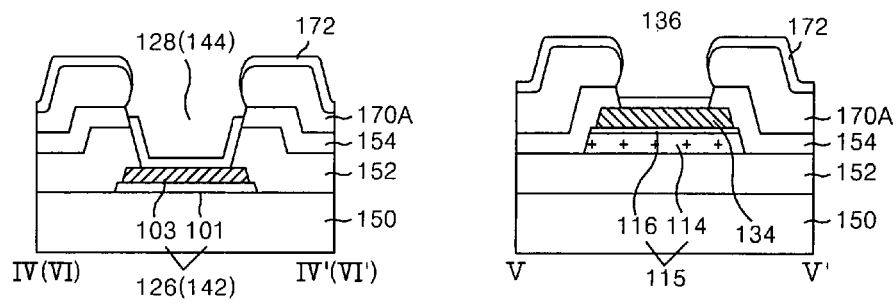

As illustrated in FIG. 10E, the transparent conductive layer 172 covering the third photo-resist pattern 170A is formed by a deposition method such as the sputtering, etc. At this time, the transparent conductive layer 172 deposited with a linearity property by the edge of the protruded third photo-resist pattern 170A is opened from the edge of the protective film 154 to thereby form a stripper infiltration path. Like the above-mentioned the first conductive layer 101, the transparent conductive layer 172 is formed of ITO, TO, IZO, etc. Also, the transparent conductive layer 172 may be replaced by an opaque metal having a strong corrosion resistance and a high strength such as Ti or W, etc.

Figure 10F:
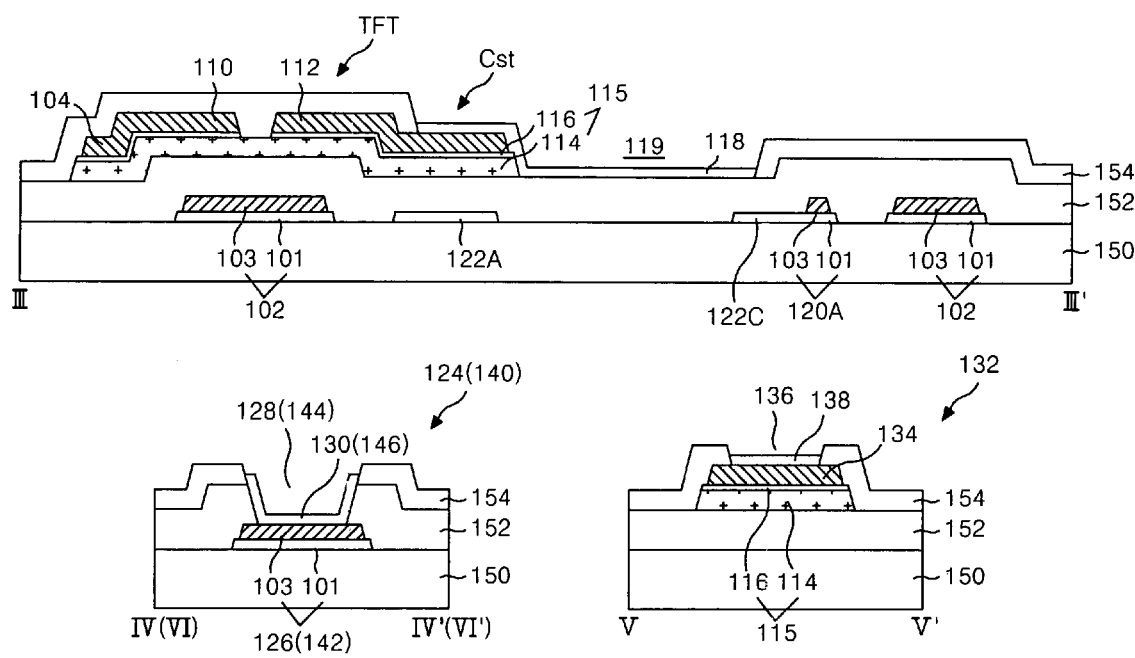

Next, as illustrated in FIG. 10F, both the third photo-resist pattern 170A and the transparent conductive layer 172 on it are lifted-off by the stripping process to thereby provide a third mask pattern group including the pixel electrode 118, an upper gate pad electrode 130, an upper common pad electrode 146 and the upper data pad electrode 138. In this case, a stripper infiltration is easily infiltrated into an area between the third photo-resist pattern 170A and the protective film 154 through the stripper infiltration path at which the transparent conductive film 172 is opened from the edge of the protective film 154, thereby improving a lift-off efficiency. As a result, the pixel electrode 118 is provided in the pixel hole 118 to be connected to the drain electrode 112. The upper gate pad electrode 130 is provided within the first contact hole 128 to be connected to the lower gate pad electrode 126. The upper data pad electrode 138 is provided within the second contact hole 136 to be connected to the lower data pad electrode 134. The upper common pad electrode 146 is provided within the third contact hole 144 to be connected to the lower common pad electrode 142. Such a second mask pattern group makes an interface with the protective film 154 within the corresponding hole.

As described above, in the method of fabricating the thin film transistor substrate according to the first embodiment of the present invention, the first mask pattern group including a single-layer structure of the common electrode 122 and a double-layer structure of the gate line 102, the common line 120, the lower gate pad electrode 126 and the lower common pad electrode 142 is formed by utilizing a half tone (or a diffractive exposure) mask. Furthermore, in the method of fabricating the thin film transistor substrate according to the first embodiment of the present invention, the pixel hole 119 and the first to third contact hole 128, 136 and 144 are defined by utilizing a half tone (or a diffractive exposure) mask. Also, the transparent conductive layer is patterned by a lift-off process of the photo-resist pattern used upon defining of said holes to thereby provide the third mask pattern group including the pixel electrode 118, the upper gate pad electrode 130, the upper common pad electrode 146 and the upper data pad electrode 138. As a result, a method of fabricating the thin film transistor substrate according to the present invention may not only improve an aperture ratio owing to the finger part 122B of the transparent common electrode 122, but also simplify the entire process by the third mask process.

Figure 11:
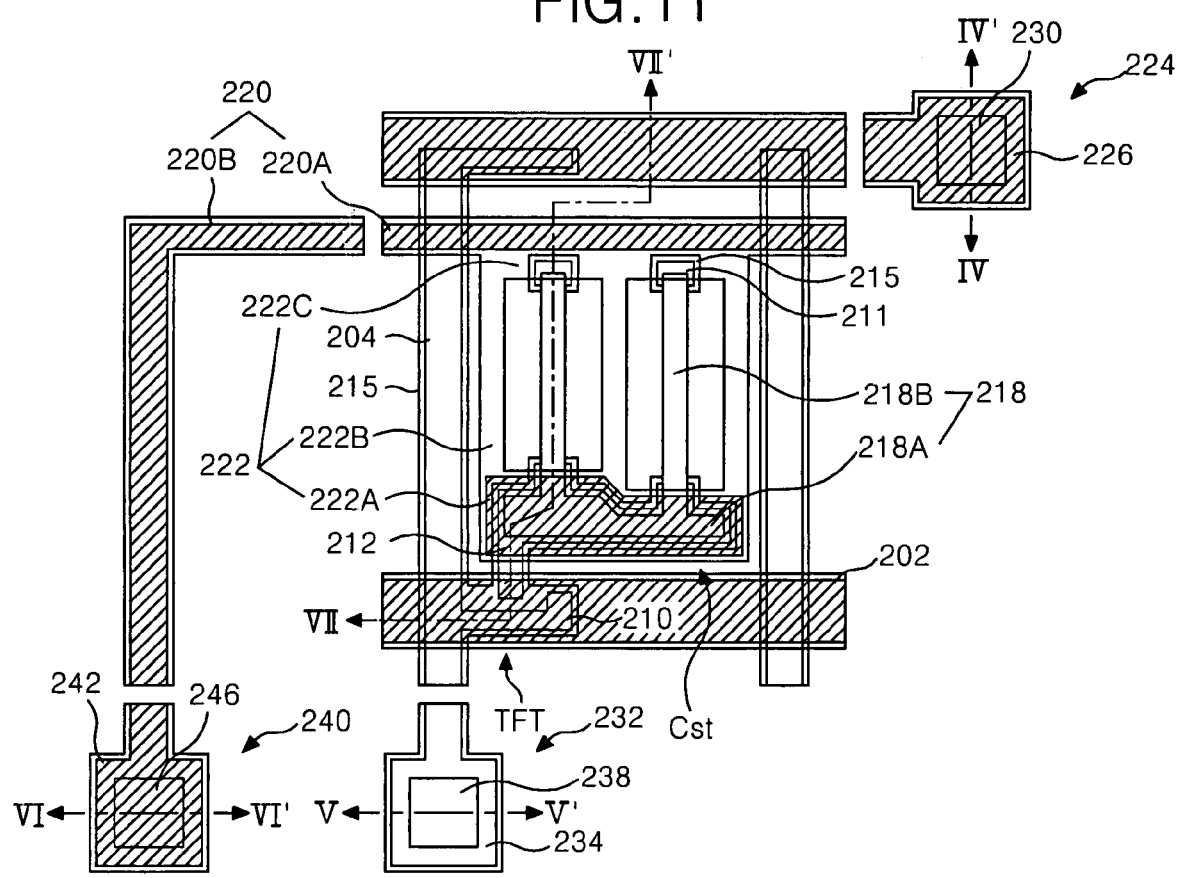
FIG. 11 is a plan view illustrating a portion of the thin film transistor substrate of horizontal electric field applying type according to a second embodiment of the present invention.
Figure 12:
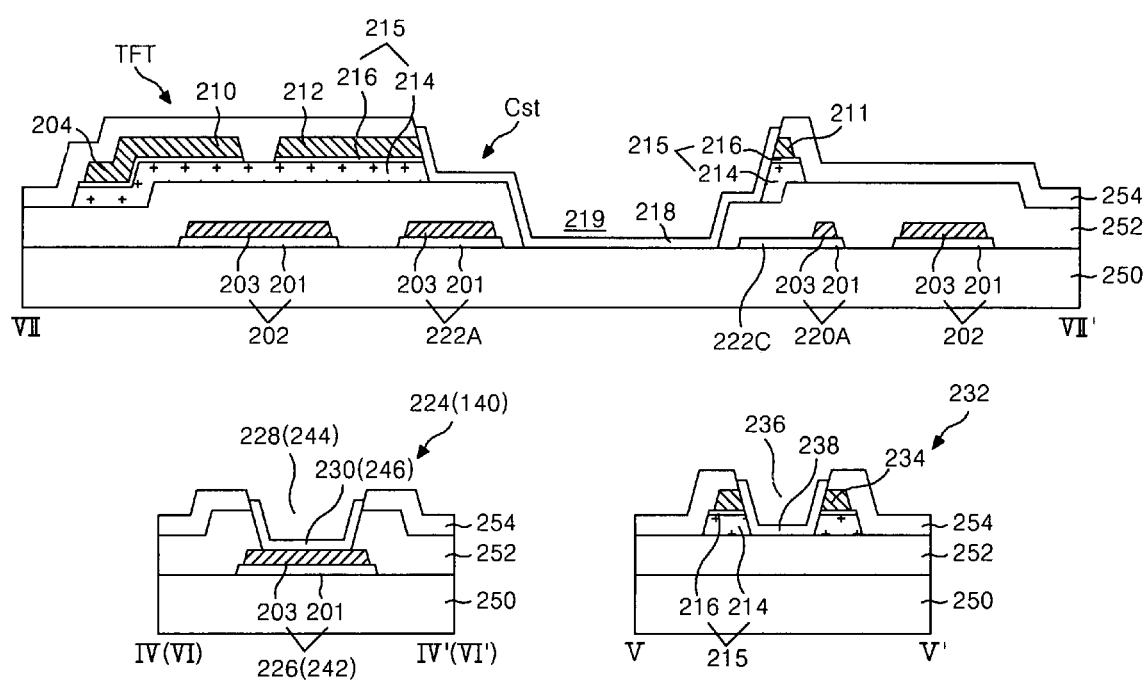
FIG. 12 is a sectional view of the thin film transistor substrate taken along the IV-IV', V-V', VI-VI' and VII-VII' lines in FIG. 11.

FIG. 11 is a plan view illustrating a portion of a thin film transistor substrate according to a second embodiment of the present invention, and FIG. 12 is a section view of the thin film transistor substrate taken along the IV-IV', V-V', VI-VI', and VII-VII' lines in FIG. 11.

The gate line 202 and the data line 204 cross each other with having a gate insulating film 252 therebetween to define the pixel area. Herein, the gate line 202 has a double-layer structure in which a first conductive layer 201 formed of a transparent conductive layer and a second conductive layer 203 formed of an opaque metal are built.

The thin film transistor TFT includes a gate electrode included in the gate line 202, a source electrode 210 connected to the data line 204, a drain electrode 212 positioned in opposition to the source electrode 210 to be connected to a pixel electrode 218, an active layer 214 overlapping with the gate line 202 with the gate insulating film 252 therebetween to provide a channel between the source electrode 210 and the drain electrode 212, and an ohmic contact layer 216 formed on the active layer 214 other than the channel portion to form an ohmic contact with the source electrode 210 and the drain electrode 212.

Further, a semiconductor pattern 215 including the active layer 214 and the ohmic contact layer 216 also overlaps with the data line 204 and the lower data pad electrode 234.

The common line 220 includes an internal common line 220A provided in parallel to the gate line 202 at a display area, and an external common line 220B commonly connected to the internal common line 220A at an non-display area. The common line 220 is formed of a double-layer structure of the first and second conductive layers 201 and 203 like the gate line 102.

The common electrode 222 is provided within the pixel area to be connected to the internal common line 220A. More specifically, the common electrode 222 includes a first horizontal part 222A adjacent to the gate line 202, and a finger part 222B extended from the first horizontal part 222A into the pixel area. Further, the common electrode 222 may include a second horizontal part 222C commonly connected to a finger part 222B and connected to the internal common line 220A. Herein, the finger part 222B and the second horizontal part 222C of the common electrode 222 are formed only of a transparent conductive layer like the first conductive layer 101 of the common line 120, whereas the first horizontal part 222A has a double conductive layer structure like the common line 220.

The pixel electrode 218 makes an interface with the protective film 254 within a pixel hole 219, and is connected, on a side basis, to the drain electrode 212 exposed through a pixel hole 219.

Specifically, the pixel hole 219 has a non-overlapping portion and an overlapping portion with respect to the common electrode 222. The non-overlapping portion of the pixel hole 219 passes through the protective film 254 and the gate insulating film 252 to be parallel to the finger part 222B of the common electrode 222. On the other hand, the overlapping portion of the pixel hole 219 is an area at which it overlaps with the low portions of the finger part 222B and the first horizontal part 222A of the common electrode 222, and is provided in such a manner to pass through the protective film 154, the drain electrode 212 and the semiconductor pattern 215. At this time, an etching of the drain electrode 212 and the semiconductor pattern 215 overlapped with the common electrode 222 prevents an etching of the gate insulating film 252 under them. Accordingly, the gate insulating film 252 covering the common electrode 222 exists in the overlapping portion of the pixel hole 219, it becomes possible to prevent a short badness between the pixel electrode 218 and the common electrode 122. Further, the drain electrode 212 and the semiconductor pattern 215 overlapped with the common electrode 222 are left in such a manner to cover the edge of the overlapping part of the pixel hole 219.

The pixel electrode 218 is provided in such a manner to make an interface with the protective film 254 within the pixel hole 219, thereby including a horizontal part 218A overlapped with the first horizontal part 222A of the common electrode 222 and a finger part 218B extended from the horizontal part 218A in parallel to the finger part 222B of the common electrode 222. Further, the pixel electrode 218 is connected, via the edge of the pixel hole 219, to the drain electrode 212 and the semiconductor pattern 215 on a side basis.

Furthermore, the finger part 218B of the pixel electrode 218 is extended in such a manner to overlap with a second horizontal part 222C of the common electrode 222. At this overlapping portion, a dummy pattern 211 and a semiconductor pattern 215 are left so as to prevent a generation of short badness caused by an etching of the gate insulating film 252.

The storage capacitor Cst is provided such that the horizontal part 218A of the pixel electrode 218 overlaps with the first horizontal part 222A of the common electrode 222 with the gate insulating film 252 therebetween. Accordingly, a distance between the horizontal part 218A of the pixel electrode 218 and the first horizontal part 222A of the common electrode 222 is reduced, so that a capacitance value of the storage capacitor Cst is more increased. Herein, the first horizontal part 222A of the common electrode 222 having a double conductive layer structure plays a role to prevent a light leakage made through the storage capacitor Cst.

The gate pad 224 includes a lower gate pad electrode 226 having a double-layer structure to be connected to the gate line 202, and an upper gate pad electrode 230 provided within the first contact hole 228 passing through the gate insulating film 252 and the protective film 254 to be connected to the lower gate pad electrode 226.

The data pad 232 includes a lower data pad electrode 234 extended from the data line 204 and the semiconductor pattern 215 under it, and an upper data pad electrode 238 provided within the second contact hole 236 passing through the protective film 254, the lower data pad electrode 234 and the semiconductor pattern 215 to be connected, on a side basis, to the lower data pad electrode 234.

The common pad 240 includes a lower common pad electrode 242 having a double-layer structure to be connected to the external common line 220B, and an upper common pad electrode 246 provided within the third contact hole 244 passing through the gate insulating film 252 and the protective film 254 to be connected to the lower common pad electrode 242.

Figure 13:
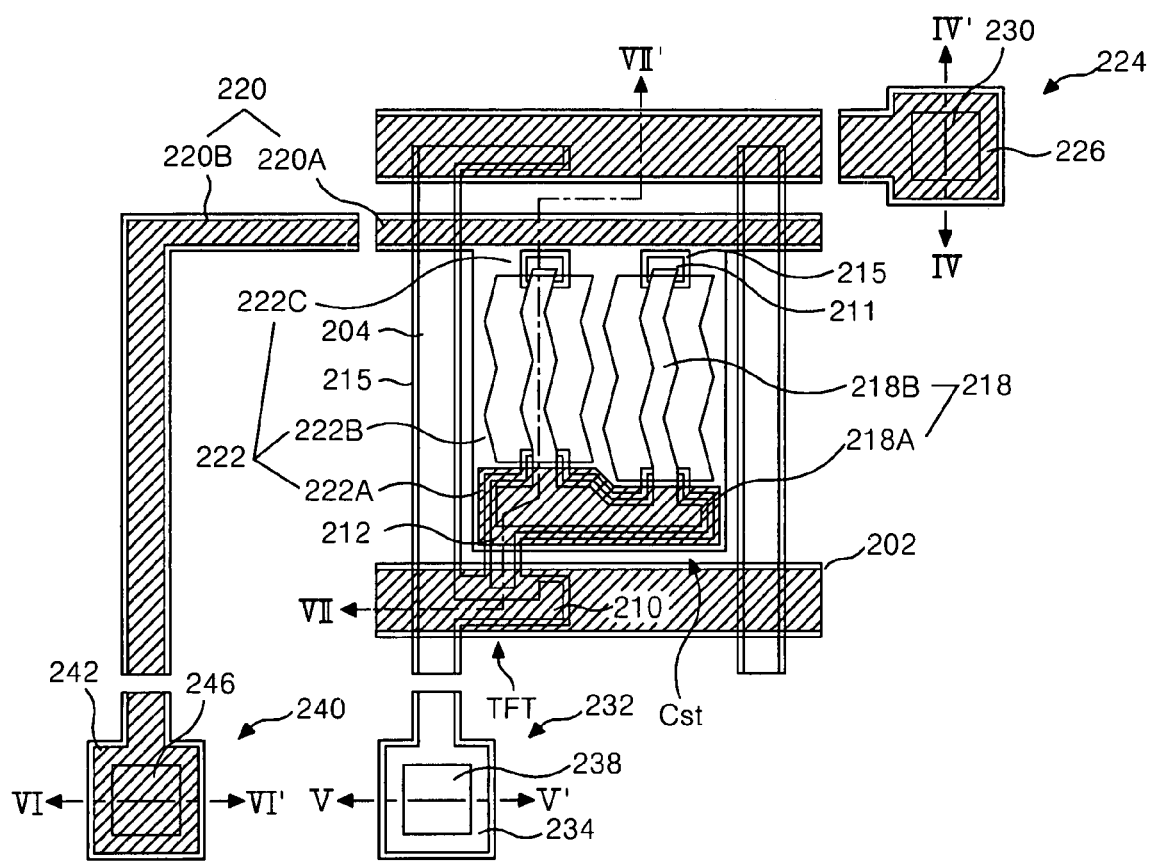
FIG. 13 is a plan view illustrating a structure of the common electrode and the pixel electrode in the thin film transistor substrate of horizontal electric field applying type illustrated in FIG. 11.

Further, as illustrated in FIG. 13, the finger part 222B of the common electrode 222 and the pixel electrode 218 may be formed in a zigzag manner. In this case, the edge of the finger part 222B of the common electrode 222 adjacent to the data line 204 may be formed in such a manner to be parallel to the data line 204, or in a zigzag manner. Alternatively, the data line 204 may be formed in a zigzag manner along the finger part 222B of the adjacent common electrode 222.

The thin film transistor substrate according to the present invention having the above-mentioned structure is formed by the following three-round mask process.

Figure 14A:
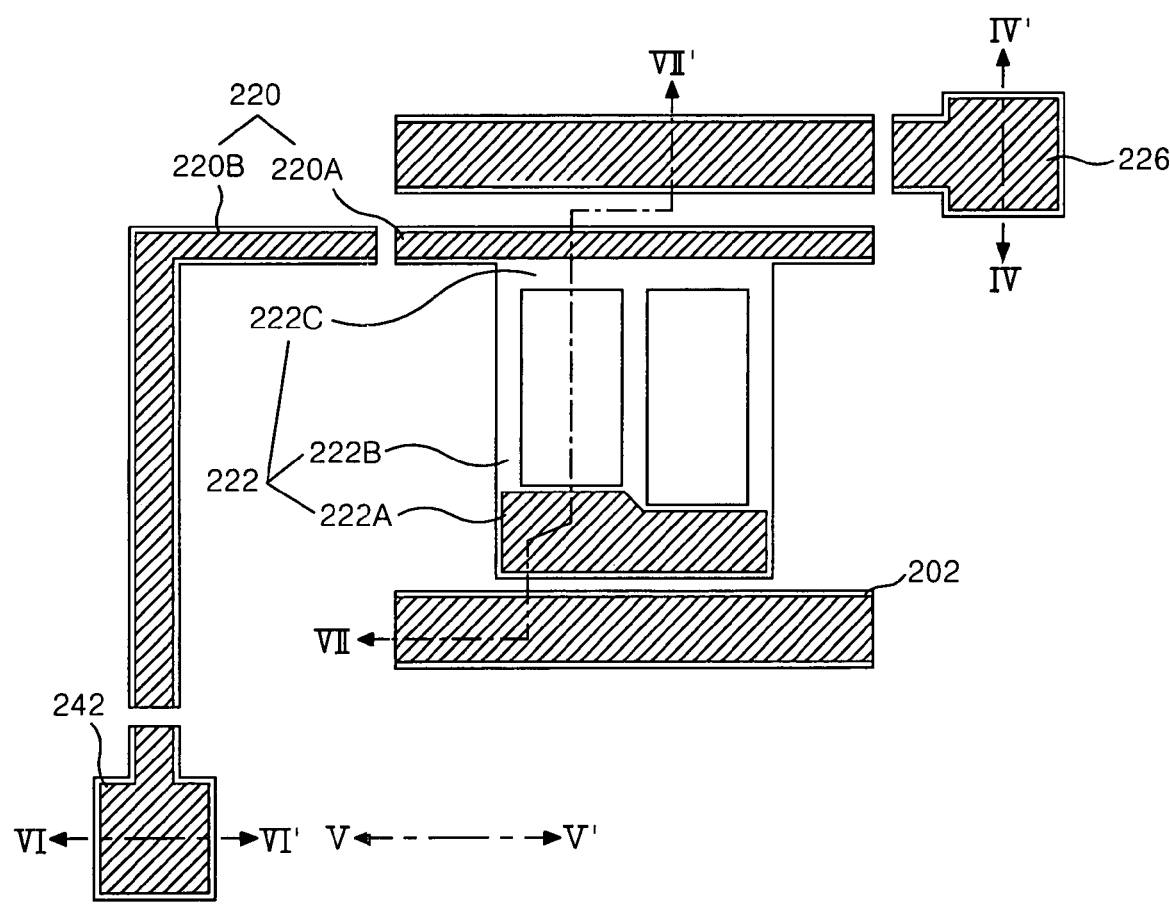
FIG. 14A and FIG. 14B are a plan view and a sectional view for explaining a first mask process in a method of fabricating the thin film transistor substrate of horizontal electric field applying type according to a second embodiment of the present invention.
Figure 14B:
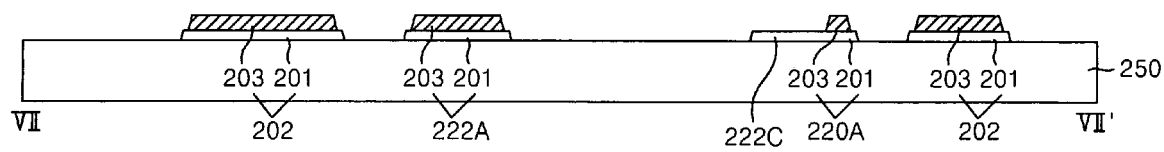
Figure 14B:
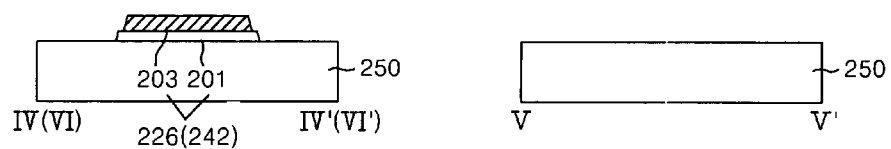
Figure 14B:
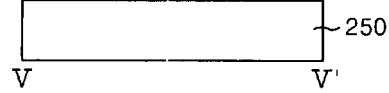

FIG. 14A and FIG. 14B are a plan view and a section view for explaining a first mask process, respectively, in a method of fabricating the semi-transmitting thin film transistor substrate of horizontal electric field applying type according to a second embodiment of the present invention.

A first mask pattern group including the gate line 202, the lower gate pad electrode 226, the common line 220, the common electrode 222 and the lower common pad electrode 242 is formed on the lower substrate 250 by the first mask process. Herein, the first mask pattern group other than the finger part 222B of the common electrode 122 and the second horizontal part 222C has a double-layer structure in which the first and second conductive layers 201 and 203 are built, whereas the finger part 222B and the second horizontal part 222C of the common electrode 222 has a single-layer structure of the first conductive layer 101 that is a transparent conductive layer. The first mask pattern group having such double-layer and single-layer structure is formed by a single of mask process employing a half tone mask or a diffractive exposure mask. Since such a first mask process is identical to the process described with reference to FIG. 7A to FIG. 7E, a detailed explanation as to it will be omitted, However, please note that the subject first mask process has a difference in that the first horizontal part 222A of the common electrode 222 has a double conductive layer structure to prevent a light leakage.

Figure 15A:
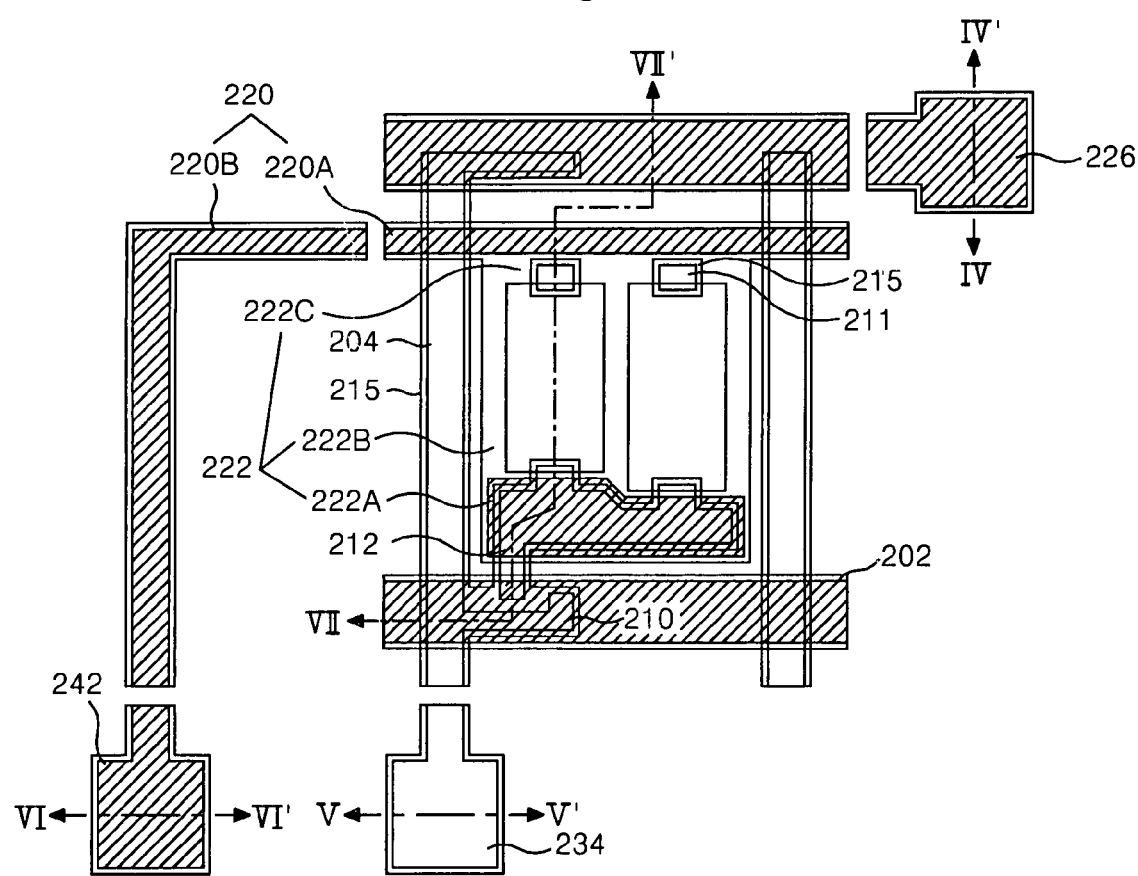
FIG. 15A and FIG. 15B are a plan view and a sectional view for explaining a second mask process in a method of fabricating the thin film transistor substrate of horizontal electric field applying type according to a second embodiment of the present invention.
Figure 15B:
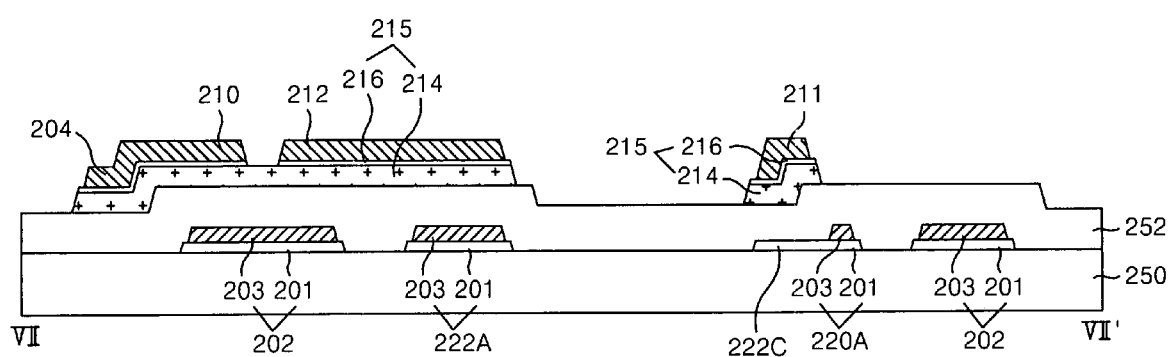
Figure 15B:
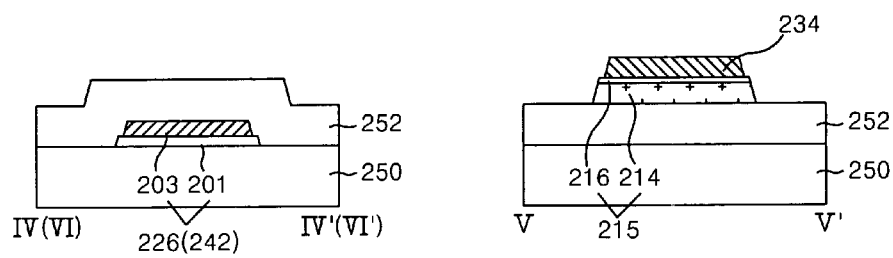

FIG. 15A and FIG. 15B are a plan view and a sectional view for explaining a second mask process, respectively, in a method of fabricating the thin film transistor substrate of horizontal electric field applying type according to a second embodiment of the present invention.

The gate insulating film 252 is formed on the lower substrate 250 provided with the first mask pattern group, and a second mask pattern group having a source/drain pattern including the data line 204, the source electrode 210, the drain electrode 212, the lower data pad electrode 234 and the dummy pattern 211; and a semiconductor pattern 215 including the active layer 214 and the ohmic contact layer 216 overlapped along the rear side of the source/drain pattern are formed thereon by the second mask process. Such a second mask pattern group is formed by a single of mask process employing a diffractive exposure mask or a half tone mask. Since such a second mask process is substantially identical to the process described with reference to FIG. 9A to FIG. 9E, a detailed explanation as to it will be omitted, However, please note that the subject second mask process has a difference in that the dummy pattern 211 overlapped with the second horizontal part 222C of the common electrode 222, along with the semiconductor pattern 215, is further provided.

Figure 16A:
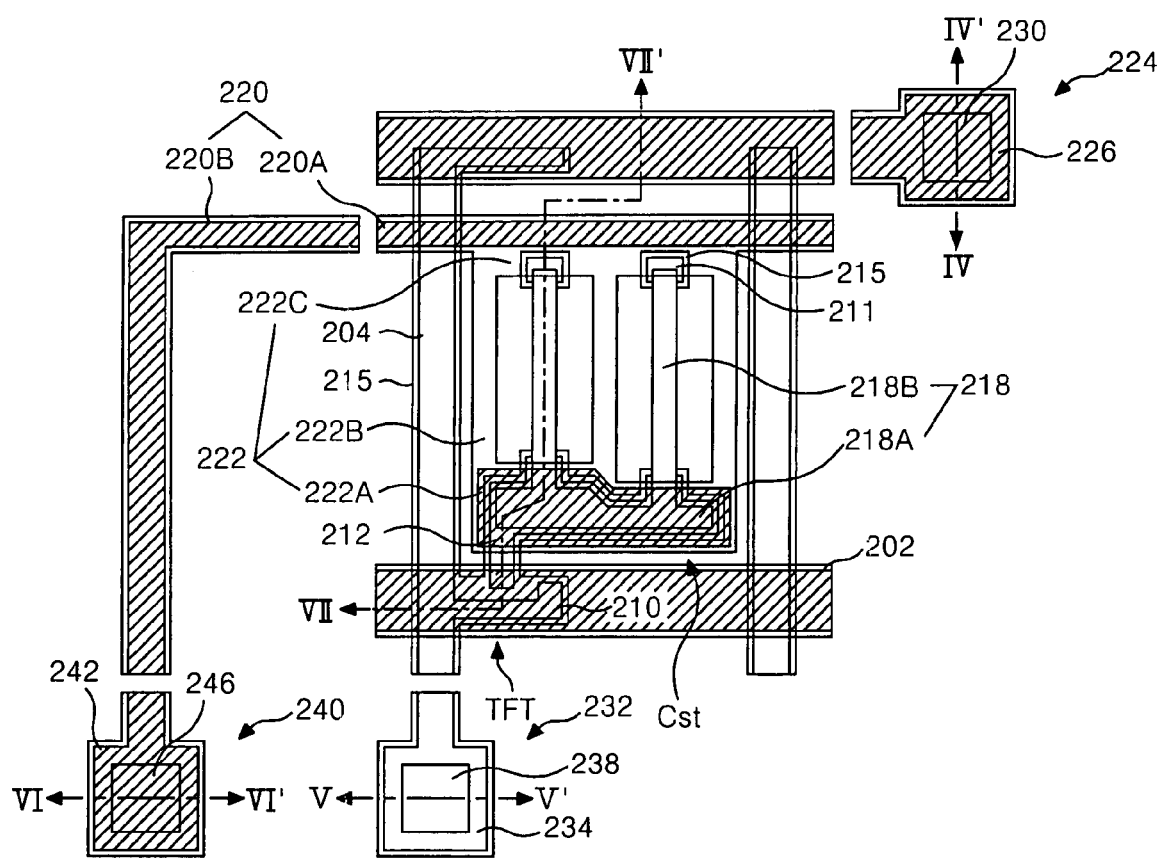
FIG. 16A and FIG. 16B are a plan view and a sectional view for explaining a third mask process in a method of fabricating the thin film transistor substrate of horizontal electric field applying type according to a second embodiment of the present invention.
Figure 16B:
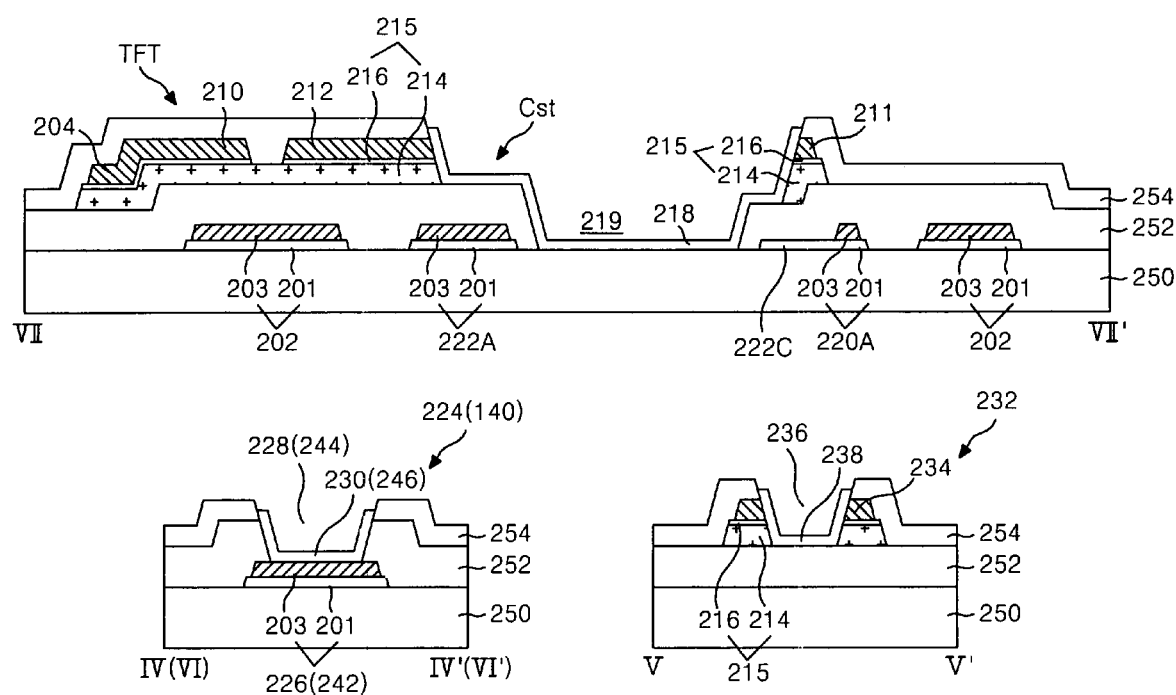

FIG. 16A and FIG. 16B are a plan view and a section view for explaining a third mask process in a method of fabricating the thin film transistor substrate according to a second embodiment of the present invention, respectively, and FIG. 17A to FIG. 17E are section views for specifically explaining the third mask process.

After the protective film 254 was formed, the pixel hole 219 and the first to third contact holes 228, 236 and 244; and the third mask pattern group including the pixel electrode 218, the upper gate pad electrode 230, the upper data pad electrode 238 and the upper common pad electrode 246 are formed by the third mask process. Herein, the third mask pattern group is provided by forming a transparent conductive layer on a photo-resist pattern used upon defining of the first to third contact holes 228, 236 and 244 and then lifting off the photo-resist pattern.

Figure 17A:
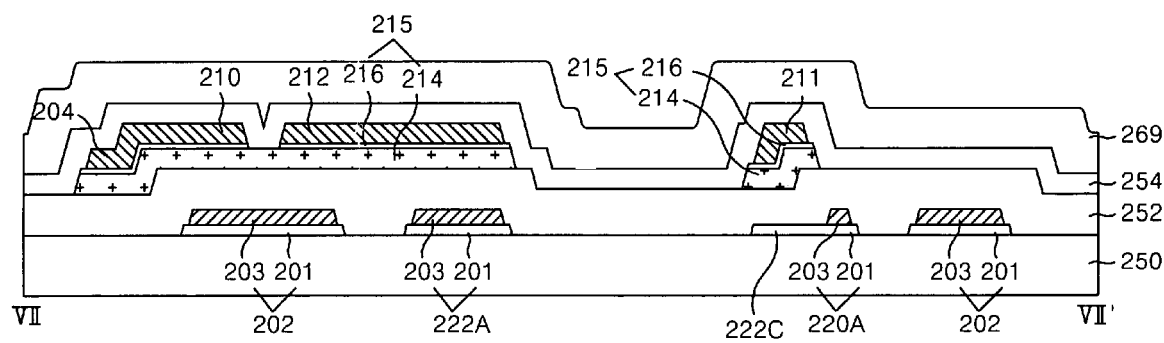
FIG. 17A to FIG. 17E are sectional views for specifically explaining the third mask process.
Figure 17A:
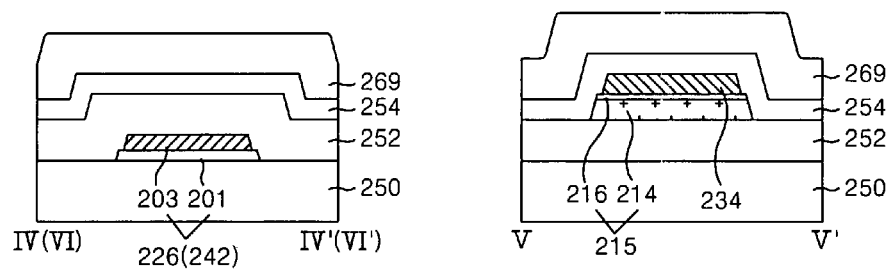

More specifically, as illustrated in FIG. 17A, the protective film 254 is formed on the gate insulating film 252 provided with the second mask pattern group by a technique such as the PECVD, the spin coating and the spinless coating etc.; and the third photo-resist 269 is coated thereon.

Figure 17B:
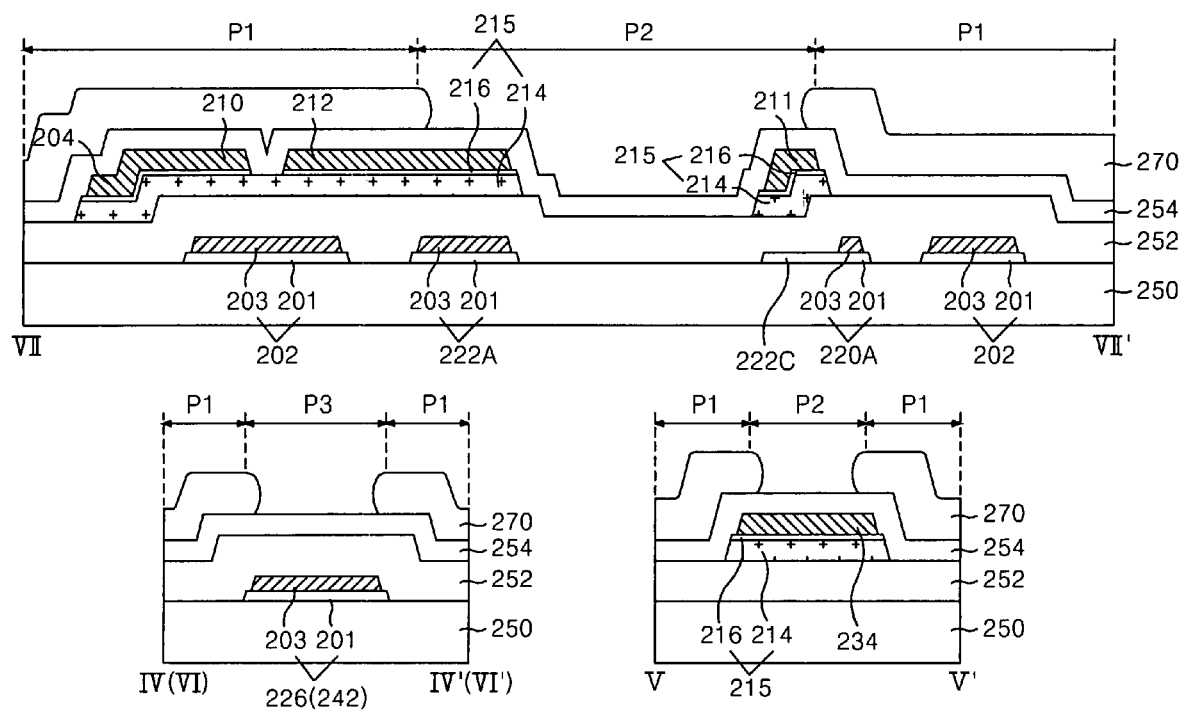

Subsequently, the third photo-resist 269 is exposed and developed by the photolithography using a third mask. Thus, as illustrated in FIG. 17B, the photo-resist pattern 270 is left only at a shielding area P1 overlapping with the shielding part of the third mask, whereas the photo-resist at a full exposure area P2 overlapping with the full transmitting part is removed.

Figure 17C:
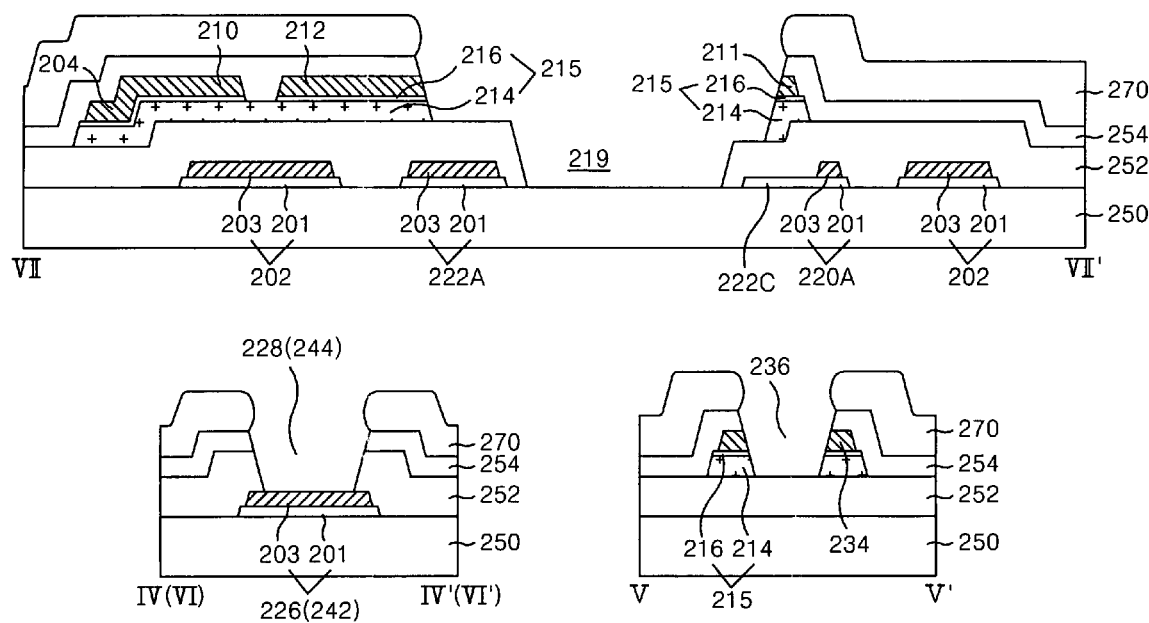

The protective film 254 and the gate insulating film 252 exposed through the photo-resist pattern 270 are etched by the dry etching process to thereby define the pixel hole 219 and the first to third contact hole 228, 236 and 244 as illustrated in FIG. 17C. The pixel hole 219 passes through the protective film 254 and the gate insulating film 252 at an area where it does not overlaps with the common electrode 222; passes through the protective film 254, the drain electrode 212 and the semiconductor pattern 215, sequentially, at one area where it overlaps with the common electrode 222; and passes through the protective film 254, the dummy pattern 211 and the semiconductor pattern 215, sequentially, at other area where it overlaps with the common electrode 222. In this case, the source/drain metal layer is formed of Mo, etc having an easy dry-etching property. Accordingly, the gate insulating film 252 is left at the overlapping portions of the pixel hole 219 and the common electrode 222. The first and third contact hole 228 and 244 passes through the protective film 254 and the gate insulating film 252. The second contact hole 236 passes through the protective film 254, the lower data pad electrode 234 and the semiconductor pattern 215 sequentially. In this case, the edge of the photo-resist pattern 270 has more protruded shape than that of the protective film 254 owing to an over-etching of the protective film 154.

Figure 17D:
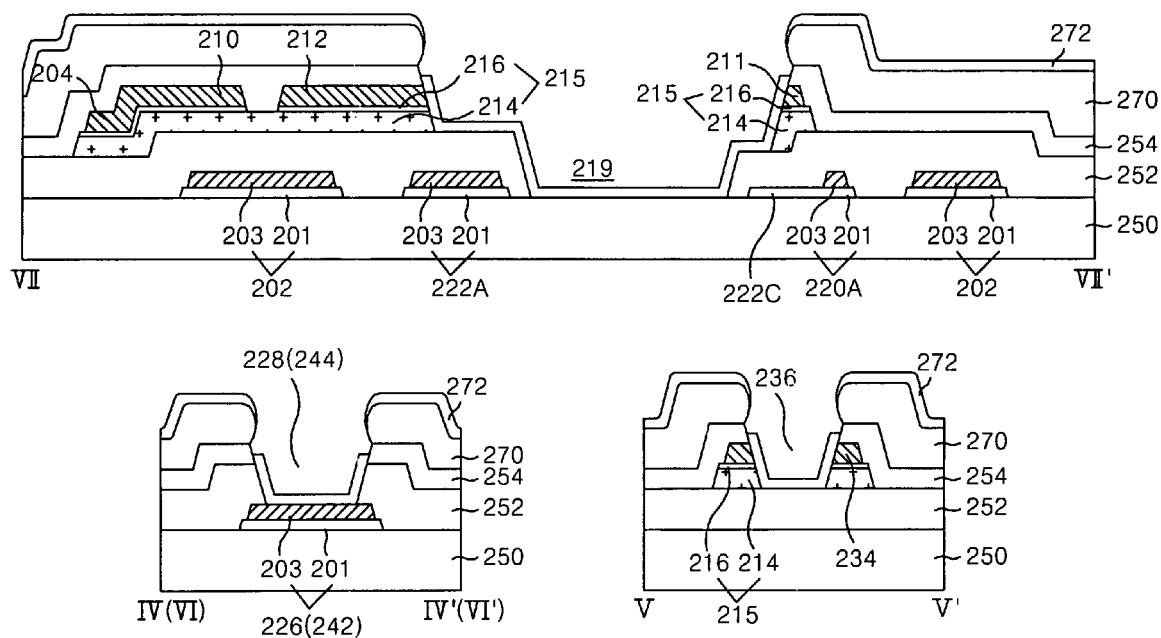

As illustrated in FIG. 17D, the transparent conductive layer 272 covering the photo-resist pattern 270 is formed by a deposition method such as the sputtering, etc. At this time, the transparent conductive layer 272 deposited with a linearity property by the edge of the protruded photo-resist pattern 270 is opened from the edge of the protective film 254 to thereby form a stripper infiltration path.

Figure 17E:
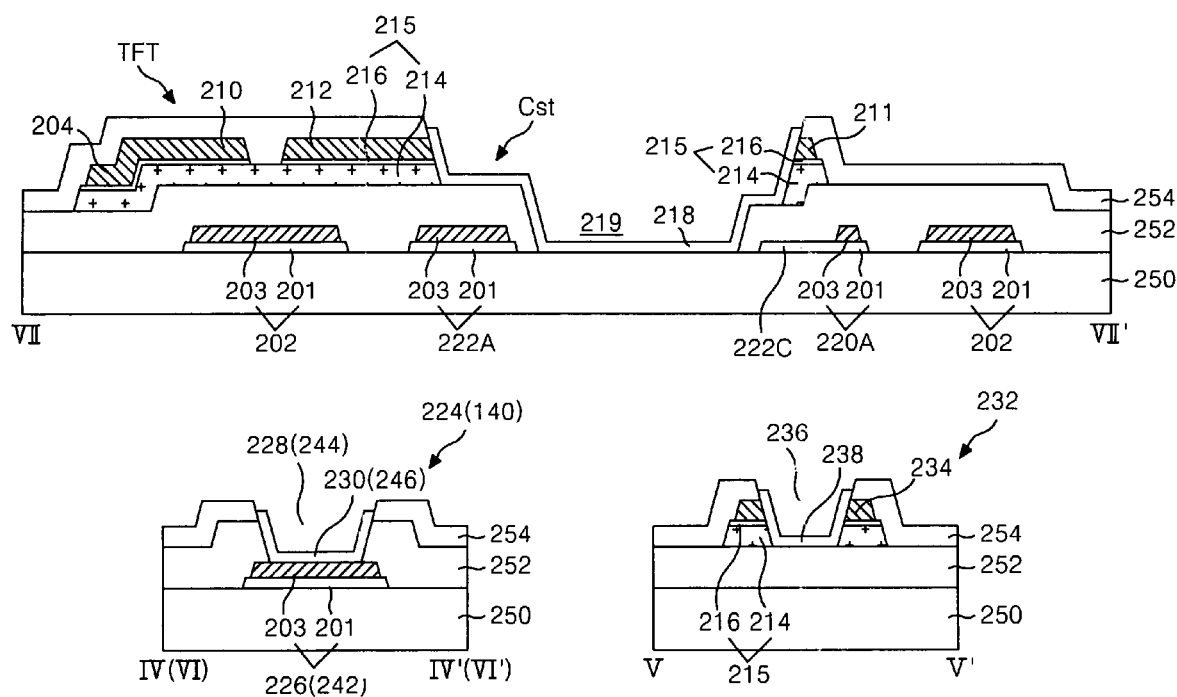

Next, both the photo-resist pattern 270 and the transparent conductive layer 272 on it are lifted-off by the stripping process to thereby provide a third mask pattern group including the pixel electrode 218, an upper gate pad electrode 230, an upper common pad electrode 246 and the upper data pad electrode 238 as illustrated in FIG. 17E. In this case, a stripper infiltration is easily infiltrated into an area between the third photo-resist pattern 270 and the protective film 254 through the stripper infiltration path at which the transparent conductive film 272 is opened from the edge of the protective film 254, thereby improving a lift-off efficiency. As a result, the pixel electrode 218 is provided within the pixel hole 219 to be connected to the drain electrode 112 on a side basis. The upper gate pad electrode 230 is provided within the first contact hole 228 to be connected to the lower gate pad electrode 226. The upper data pad electrode 238 is provided within the second contact hole 236 to be connected to the lower data pad electrode 234 on a side basis. The upper common pad electrode 246 is provided within the third contact hole 244 to be connected to the lower common pad electrode 242. Such a second mask pattern group makes an interface with the protective film 254 within the corresponding hole.

Such a method of fabricating the thin film transistor substrate according to the second embodiment of the present invention has a difference from the first embodiment of the present invention in which the pixel hole 119 and the third contact hole 136 are provided at a partial exposure area in that the pixel hole 219 and the third contact hole 236 are provided at an full exposure area. Accordingly, an ashing process of the photo-resist pattern and an etching process of the protective film exposed through the ashed photo-resist pattern included in the first embodiment are eliminated, so that a process time may be reduced to improve the productivity. Also, the succeeding lifting-off process of the pixel electrode 218 may be easily performed to assure a process simplification.

Furthermore, if the pixel hole 219 is defined by a full exposure, then it may obtain a narrower line width than the pixel hole 119 in the first embodiment defined by a partial exposure. As a result, a line width of the pixel electrode 218 defined within the pixel hole 219 is reduced, so that it becomes possible to obtain an effect of increasing an aperture ratio between the finger part 218B of the pixel electrode 218 and the finger part 222B of the common electrode 222.

As described above, according to the present invention, a single-layer structure of common electrode can be formed along with a double-layer structure of other first mask pattern group by the half tone (or diffractive exposure) mask.

Furthermore, according to the present invention, the transparent conductive film is patterned by the lifting-off process of the photo-resist pattern upon patterning of the protective film to thereby provide the third mask pattern group.

Moreover, according to the present invention, the pixel hole and the second contact hole passing through the protective film are defined by a partial exposure while the first and third contact holes passing through an area extended to the gate insulating film by a full exposure by utilizing the half tone (or diffractive exposure) mask.

Accordingly, according to the present invention, the entire process may be simplified by the three-round mask process.

Furthermore, according to the present invention, the pixel hole and the third contact hole are defined by a full exposure, so that an ashing process of the photo-resist pattern and an etching process of the protective film exposed through the ashed photo-resist pattern can be eliminated in comparison to a case where they is defined by a partial exposure. Thus, it becomes possible to reduce a process time.

Moreover, according to the present invention, the pixel hole is defined by a full exposure, so that it can obtain a narrower line width than the pixel hole defined by a partial exposure. As a result, a line width of the pixel electrode defined within the pixel hole is reduced, so that it becomes possible to obtain an effect of increasing an aperture ratio between the finger part of the pixel electrode and the finger part of the common electrode.

Although the present invention has been explained by the embodiments illustrated in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display device, comprising:

forming a first mask pattern group including a gate line, a gate electrode and a common line having a double-layer structure of a first transparent conductive layer and a second opaque conductive layer, and a common electrode having a single-layer structure of a first conductive layer of the common line on a substrate using a first mask;

forming a gate insulating film on the first mask pattern group;

forming a second mask pattern group including a semiconductor pattern and a source/drain pattern having a data line, a source electrode and a drain electrode overlapped on the gate insulating film using a second mask;

forming a protective film on the second mask pattern group; and forming a pixel hole passing through the protective film, and forming a third mask pattern group including a pixel electrode making an interface with the protective film in the pixel hole to be connected to the drain electrode, thereby forming a horizontal electric field with the common electrode, using a third mask.

2. The method as claimed in claim 1, wherein forming the first mask pattern group includes:

forming the first and second conductive layers on a substrate;

forming first and second photo-resist patterns having a different thickness on the second conductive layer by a photolithography using one of a half tone mask and a diffractive exposure mask;

forming the first mask pattern group having the double-layer structure by patterning the first and second conductive layers by an etching process using the first and second photo-resist patterns;

allowing the first photo-resist pattern to be thinned and removing the second photo-resist pattern by an ashing process;

removing the second conductive layer on the common electrode by an etching process using the ashed first photo-resist pattern; and removing the ashed first photo-resist pattern.

3. The method as claimed in claim 1, further comprising:

forming a storage capacitor such that the drain electrode overlaps with a portion of the common electrode with the semiconductor pattern and the gate insulating film.

4. The method as claimed in claim 1, further comprising:

forming a storage capacitor such that the pixel electrode overlaps with a portion of the common electrode with the gate insulating film.

5. The method as claimed in claim 4, wherein an upper portion of the common electrode of the storage capacitor remains the second conductive layer.

6. The method as claimed in claim 1, wherein the common electrode includes a first horizontal part adjacent to the gate line, a finger part extended from the first horizontal part, and a second horizontal part connected to the finger part and the first conductive layer of the common line.

7. The method as claimed in claim 6, wherein the pixel electrode includes a horizontal part overlapped with the first horizontal part of the common electrode, and a finger part parallel to the finger part of the common electrode.

8. The method as claimed in claim 1, wherein forming the first mask pattern group further includes forming a lower gate pad electrode having the double-layer structure extended from the gate line; and forming the pixel hole and third mask pattern group further includes forming a first contact hole passing through the protective film and the gate insulating film, and forming an upper gate pad electrode connected to the lower gate pad electrode in the first contact hole.

9. The method as claimed in claim 8, wherein forming the second mask pattern group further includes forming a lower data pad electrode extended from the data line along with the semiconductor pattern; and forming the pixel hole and third mask pattern group further includes forming a third contact hole passing through the protective film, and forming an upper data pad electrode connected to the lower data pad electrode within the second contact hole.

10. The method as claimed in claim 9, wherein forming the first mask pattern group further includes forming a lower common pad electrode having the double-layer structure extended from the common line; and forming the pixel hole and third mask pattern group further includes forming a third contact hole passing through the protective film and the gate insulating film, and forming an upper common pad electrode connected to the lower common pad electrode in the third contact hole.

11. The method as claimed in claim 10, wherein forming the third mask pattern group includes:
   forming first and second photo-resist patterns having a different thickness on the protective film using one of a partial transmitting mask and a diffractive exposure mask as a third mask;
   forming the first and third contact holes by etching the protective film and the gate insulating film exposed through the first and second photo-resist patterns;
   reducing a thickness of the first photo-resist pattern and forming the second photo-resist pattern by an ashing process;
   forming the pixel hole and the second contact hole by etching the protective film exposed through the ashed first photo-resist pattern;
   forming a third conductive layer on the first photo-resist pattern; and
   forming the third mask pattern group in the pixel hole and the first to third contact holes by lifting off the first photo-resist pattern and the third conductive layer.

12. The method as claimed in claim 11, wherein the pixel hole includes a non-overlapping portion that does not overlaps with the common electrode to expose the gate insulating film, and an overlapping portion that overlaps with the common electrode to expose the drain electrode overlapped with the common electrode.

13. The method as claimed in claim 12, wherein the pixel electrode is overlapped with and connected to the drain electrode exposed through the pixel hole.

14. The method as claimed in claim 10, wherein forming the third mask pattern group includes:
   forming a photo-resist pattern on the protective film using a third mask;
   forming the pixel hole and the first to third contact holes by etching the protective film and the gate insulating film exposed through the photo-resist pattern;
   forming a third conductive layer on the photo-resist pattern; and
   forming the third mask pattern group in the pixel hole and the first to third contact holes by lifting off the photo-resist pattern along with the third conductive layer.

15. The method as claimed in claim 14, wherein the pixel hole includes a non-overlapping portion that does not overlaps with the common electrode, and an overlapping portion that overlaps with the common electrode, and wherein the non-overlapping portion of the pixel hole passes through the protective film and the gate insulating film to expose the substrate; and the overlapping portion of the pixel hole passes through the drain electrode and the semiconductor pattern overlapped with the common electrode along with the protective film to expose the gate insulating film.

16. The method as claimed in claim 15, wherein the drain electrode and the semiconductor pattern overlapped with the common electrode remain in such a manner to enclose an edge of the overlapping portion of the pixel hole.

17. The method as claimed in claim 16, wherein the pixel electrode is connected, via an edge of the pixel hole, to the drain electrode on a side basis.

18. The method as claimed in claim 15, further comprising:
   forming a dummy pattern and a semiconductor pattern overlapped with the common electrode with the gate insulating film,
   wherein the overlapping portion of the pixel hole passes through the dummy pattern and the semiconductor pattern along with the protective film to expose the gate insulating film.

19. The method as claimed in claim 18, wherein the dummy pattern and the semiconductor pattern overlapped with the common electrode remain in such a manner to enclose the edge of the overlapping portion of the pixel hole.

20. The method as claimed in claim 14, wherein the second contact hole passes through an area extended to the lower data pad electrode and the semiconductor pattern; and the upper data pad electrode is connected, via an edge of the second contact hole, to the lower data pad electrode on a side basis.

21. The method as claimed in claim 11, wherein the pixel electrode is formed of one of a transparent conductive layer, titanium and tungsten.

22. The method as claimed in claim 14, wherein the pixel electrode is formed of one of a transparent conductive layer, titanium and tungsten.

* * * * *